(12) United States Patent
Kim

(10) Patent No.: US 11,674,215 B2
(45) Date of Patent: Jun. 13, 2023

(54) FULL-SIZE MASK ASSEMBLY AND MANUFACTURING METHOD THEREOF

(71) Applicant: KPS CO., LTD., Hwaseong-si (KR)

(72) Inventor: Jung Ho Kim, Hwaseong-si (KR)

(73) Assignee: KPS CO., LTD., Hwaseong-si (KR)

( * ) Notice: Subject to any disclaimer, the term of this patent is extended or adjusted under 35 U.S.C. 154(b) by 225 days.

(21) Appl. No.: 17/130,895

(22) Filed: Dec. 22, 2020

(65) Prior Publication Data

US 2021/0108304 A1 Apr. 15, 2021

Related U.S. Application Data

(62) Division of application No. 16/229,943, filed on Dec. 21, 2018, now Pat. No. 11,136,663.

(30) Foreign Application Priority Data

Jun. 4, 2018 (KR) .................. 10-2018-0064033

(51) Int. Cl.
*C23C 14/04* (2006.01)
*G03F 7/20* (2006.01)
*H10K 71/16* (2023.01)

(52) U.S. Cl.
CPC .......... *C23C 14/042* (2013.01); *G03F 7/2063* (2013.01); *H10K 71/166* (2023.02)

(58) Field of Classification Search
CPC ............. H01L 51/0011; H01L 27/1251; H01L 27/1288; H05K 3/1225; G03F 7/2063; C23C 14/042; C23C 14/044
See application file for complete search history.

(56) References Cited

U.S. PATENT DOCUMENTS

| | | | |
|---|---|---|---|
| 2016/0312354 A1* | 10/2016 | Ko | ................. C23C 14/042 |
| 2018/0363127 A1 | 12/2018 | Bucci et al. | |
| 2019/0144986 A1* | 5/2019 | Bai | ................. C23C 14/042 |
| | | | 118/721 |

FOREIGN PATENT DOCUMENTS

| | | |
|---|---|---|
| JP | 2007-35440 | 2/2007 |
| JP | 2009-301789 | 12/2009 |
| JP | 2015-145532 | 8/2015 |
| KR | 10-2008-0058602 | 6/2008 |

* cited by examiner

*Primary Examiner* — Brook Kebede
(74) *Attorney, Agent, or Firm* — Kile Park Reed & Houtteman PLLC

(57) ABSTRACT

Disclosed herein is a full-size mask assembly and a manufacturing method thereof. The full-size mask assembly according to an embodiment of the present invention includes a frame having a frame opening formed therein and a support surrounding the frame opening, a structural auxiliary mask supported by the support and having a plurality of shafts in a grid shape to form a plurality of structural auxiliary mask openings, and a plurality of cell unit masks supported by the structural auxiliary mask and each of which has a deposition pattern portion through which a deposition material passes.

6 Claims, 19 Drawing Sheets

A

FULL-SIZE MASK ASSEMBLY AND MANUFACTURING METHOD THEREOF

CROSS-REFERENCE TO RELATED APPLICATION

This application is a divisional application of U.S. patent application Ser. No. 16/229,943, filed Dec. 21, 2018, the disclosure of which is herein incorporated by reference in its entirety. The U.S. patent application Ser. No. 16/229,943 claims priority to and the benefit of Korean Patent Application No. 10-2018-0064033, filed on Jun. 4, 2018, the disclosure of which is incorporated herein by reference in its entirety.

BACKGROUND

1. Field of the Invention

The present invention relates to a full-size mask assembly and a manufacturing method thereof, and more specifically, to a full-size mask assembly for depositing a deposition material on a substrate and a manufacturing method thereof.

2. Discussion of Related Art

Among display devices, an organic light emitting device (OLED) has advantages of a wide viewing angle, a high contrast, and a high response speed. Accordingly, the use field of the OLED is gradually expanding.

An intermediate layer including electrodes and a light emitting layer of the OLED may be formed by various methods, one of which is deposition.

The biggest difficulty in manufacturing a high resolution OLED in a small to medium sized OLED product is a deposition process which is a core process of preparing red, green, and blue (RGB) pixels in an OLED manufacturing process. A fine metal mask (hereinafter referred to as a "mask") having a pattern identical to patterns of a thin film and the like, which will be formed on a substrate, is aligned and a raw material of the thin film is deposited to form a thin film of a desired pattern. In the above-described deposition process, an organic material is heated at a deposition source located at a bottom of a chamber, and the heated organic material is evaporated to pass through a mask located at an upper portion and then is deposited on a thin film transistor (TFT) glass.

In the deposition process, the mask is adhered to the TFT glass with no separated portion and deposition is performed. This is because a deposition defect occurs due to a shadow effect when a separation occurs. For proper deposition, the mask having a thickness in the range of 10 μm to 30 μm should be tightly pulled out to become in a state in which elasticity is kept so as to allow flatness to be maintained with the TFT glass. In order to keep the mask tight, an additional wing for stretching is provided at an edge of the mask, and stretching is performed by holding the additional wing with a clamp capable of applying a tensile force thereto. After holes of the mask are aligned to coincide with patterns of a thin film and the like, which will be formed on the substrate, a mask frame is formed by welding overlapping portions between a frame and the edge of the mask.

For mass production, an active matrix OLED (AMOLED) panel is achieved with a half cut size in $6^{th}$ generation, but in $7^{th}$ and $8^{th}$ generation, enlargement in area of the AMOLED panel is inevitable. This is because large-area AMOLED panels can be simultaneously manufactured through a multi-panel process through the enlargement.

Further, a fine patterning operation is required as resolution becomes higher. In order to perform the fine patterning operation, sizes of the holes in the mask and a gap between the holes should be reduced. Arrangement accuracy between the TFT glass and the mask should also be accurate. Further, a thickness of the mask should be reduced. Consequently, manufacturing of the mask becomes more difficult, and a yield of the mask also drops rapidly. Further, when the TFT glass is enlarged, an etching error for pattern formation increases, and a sagging phenomenon of a central portion of the mask also becomes severe due to a weight of the mask.

FIG. 1A is a schematic diagram illustrating a stretched stick mask according to a related art.

Up to the present, a mask cannot be manufactured in single sheet unit such that a mask assembly of a stick mask type, in which a plurality of masks 1a are formed in a stick shape and attached to a frame, has been used. A stick mask 1 is configured with the plurality of masks 1a and wings required for stretching.

As a resolution becomes higher and an area increases, a width and a length of the stick mask 1 are also increased such that the number of masks 1a constituting the stick mask 1 also increases and a size of each of the masks 1a is also increased. Further, the stick mask 1 should be manufactured for a high resolution and a large area, but securing of etch uniformity is difficult such that there is difficulty in manufacturing of the stick mask 1. Furthermore, when a tensile force is applied to keep the stick mask 1 manufactured according to a design drawing in a tight state, there occurs a problem in that the stick mask 1 is deformed or wrinkles occurs on a surface of the stick mask 1.

Moreover, in order to keep the stick mask 1 manufactured according to the design drawing in a tight state, the wings of the stretched stick mask 1 are held by a clamp. In this case, there occurs a problem during stretching.

FIG. 1B is a schematic diagram illustrating a deformed state of the stretched stick mask 1 according to the related art.

The stick mask 1 is stretched in a length direction (hereinafter referred to as a "Y-direction") to become in a state of being tightly pulled out and then is coupled to a stick mask assembly. As shown in FIG. 1B, when the stick mask 1 is pulled out, contraction occurs in a direction perpendicular to the Y-direction of the stick mask 1 (hereinafter referred to as an "X-direction"), and, as a length of stick mask 1 becomes longer, a degree of contraction of each of the masks 1a becomes larger.

Currently, the stick mask 1 can be stretched in only the Y-direction but not in the X-direction. Therefore, correction in the X-direction is required such that the stick mask 1 is designed in consideration of contraction in the X-direction.

However, the tensile force applied to the stick mask 1 so as to manufacture an actual stick mask assembly is different from the tensile force considered when designed. Therefore, when the stick mask assembly is manufactured, errors occur at R, G, and B positions in the X-direction. As the resolution of the stick mask 1 becomes higher and the length of the stick mask 1 becomes longer, there is problem in that such errors occur frequently.

FIG. 2 is a schematic diagram for describing a problem which occurs when the stick mask 1 according to the related art is welded to a frame.

As shown in FIG. 2, in order to manufacture a stick mask assembly, the stick mask 1 is stretched to aligned with R, G, and B positions and then a welding region 1b of the stick mask 1 is welded to a frame from atop of the stick mask 1. In this case, the welding region 1b is welded to the frame to support only both edges of the stick mask 1.

The stick mask assembly is used for a predetermined number of times and then mask cleaning should be performed. In this case, since only both ends of the stick mask 1 are fixed to the frame in cleaning and storing, there is a problem in that mechanical strength is weak such that the stick mask 1 is easily separated from the frame.

PRIOR ART DOCUMENT

Patent Document (Patent Document 1) Korean Patent Registration No. 10-1742816 (Jun. 2, 2017)

SUMMARY OF THE INVENTION

The present invention is directed to a full-size mask assembly capable of overcoming a manufacturing limitation of a conventional stick mask and a technical limitation of enlargement in area and improving accuracy and mechanical strength of a mask.

Further, the present invention is directed to a full-size mask assembly capable of applying a tensile force to a cell unit mask in an X-direction and a Y-direction, thereby improving pixel position accuracy (PPA).

According to an aspect of the present invention, there is provided a full-size mask assembly using a cell unit mask.

The full-size mask assembly includes a frame having a frame opening formed therein and a support surrounding the frame opening, a structural auxiliary mask supported by the support and having a plurality of shafts in a grid shape to form a plurality of structural auxiliary mask openings, and a plurality of cell unit masks supported by the structural auxiliary mask and each of which has a deposition pattern portion through which a deposition material passes.

Each of the plurality of cell unit masks may be coupled to the structural auxiliary mask.

A first position alignment hole may be located at a corner of one side of the deposition pattern portion and may be provided to be aligned within the structural auxiliary mask opening in a vertical direction.

A second position alignment hole may be a plurality of reference holes of the deposition pattern portion and a center of the second position alignment hole may be aligned with a thin film transistor (TFT) position of a TFT glass in the vertical direction.

Each of the plurality of shafts may include a first cell unit support for supporting the cell unit mask in a first direction, a second cell unit support for supporting the cell unit mask in a second direction perpendicular to the first direction, and a cell unit spacer for forming a grid shape between the first cell unit support and the second cell unit support at a predetermined interval and for not being brought into contact with the cell unit mask.

The plurality of cell unit masks may be intermittently provided in the first direction and the second direction perpendicular to the first direction.

The cell unit mask may have an area that is larger than that of the structural auxiliary mask opening in the first direction and the second direction perpendicular to the first direction.

The deposition pattern portion may have an area that is smaller than that of the structural auxiliary mask opening in the first direction and the second direction perpendicular to the first direction.

The cell unit mask may further include two or more cell unit couplers at one surface thereof.

Each of the two or more cell unit couplers may be a plurality of welding points disposed in parallel.

Each of the two or more cell unit couplers may be either a first cell unit coupler formed along an end portion of the cell unit mask in the first direction or a second cell unit coupler formed in the second direction perpendicular to the first direction.

Each of the two or more cell unit couplers may include the first cell unit coupler formed along the end portion of the cell unit mask in the first direction and the second cell unit coupler formed in the second direction.

According to another aspect of the present invention, there is provided a full-size mask assembly using a cell unit mask and having a structural auxiliary mask configured with a plurality of shafts in a grid shape to form a plurality of structural auxiliary mask openings, the full-size mask assembly including a plurality of cell unit masks, each of which has a deposition pattern portion at a position facing the structural auxiliary mask opening, and supported by the structural auxiliary mask, wherein each of the plurality of cell unit masks may be coupled to the structural auxiliary mask.

Each of the plurality of shafts may include a first cell unit support configured to support the cell unit mask in a first direction, a second cell unit support configured to support the cell unit mask in a second direction perpendicular to the first direction, and a cell unit spacer having a grid shape between the first cell unit support and the second cell unit support in a state of being spaced a predetermined interval apart and configured to not support the cell unit mask.

The plurality of cell unit masks may be intermittently provided in the first direction and the second direction perpendicular to the first direction.

According to still another aspect of the present invention, there is provided a manufacturing method of a full-size mask assembly using a cell unit mask.

The manufacturing method of a full-size mask assembly provided by directing a cell unit mask to face a structural auxiliary mask opening formed in a structural auxiliary mask, the method includes a structural auxiliary mask aligning operation of aligning the structural auxiliary mask with a frame opening formed at a frame to face the frame opening, a structural auxiliary mask stretching operation of stretching the structural auxiliary mask in a first direction and a second direction, a structural auxiliary mask fixing operation of fixing the structural auxiliary mask to the frame by forming a welding portion between the frame and the structural auxiliary mask, a cell unit mask aligning operation of aligning the cell unit mask with the structural auxiliary mask opening of the structural auxiliary mask to face the structural auxiliary mask opening, and a cell unit mask fixing operation of fixing the cell unit mask to the structural auxiliary mask by forming a cell unit coupler between the structural auxiliary mask and the cell unit mask.

The cell unit mask aligning operation may include a cell unit mask stretching operation of applying, by a cell mask gripper, a tensile force to the cell unit mask in the first and second directions, a cell unit mask first position alignment operation of aligning a first position alignment hole, which is located at a corner of one side of a deposition pattern portion through which a deposition material passes, within the structural auxiliary mask opening in a vertical direction, a cell unit mask second position alignment operation of aligning a plurality of second position alignment holes of the deposition pattern portion at a thin film transistor (TFT)

position of a TFT glass in the vertical direction, and a cell unit mask seating operation of seating the cell unit mask in the structural auxiliary mask opening.

The cell unit mask second position alignment operation may include aligning a center of the plurality of second position alignment holes with the TFT position.

The cell unit mask fixing operation may include welding the structural auxiliary mask to the cell unit mask using a laser beam located below the full-size mask assembly.

According to yet another aspect of the present invention, there is provided a manufacturing method of a full-size mask assembly including a cell unit mask aligning operation of aligning each of cell unit masks to face a structural auxiliary mask opening formed at a structural auxiliary mask fixed to a frame.

The cell unit mask aligning operation may include a cell unit mask stretching operation of applying, by a cell mask gripper, a tensile force to the cell unit mask in first and second directions, a cell unit mask first position alignment operation of aligning a first position alignment hole, which is located at a corner of one side of a deposition pattern portion through which a deposition material passes, within the structural auxiliary mask opening in a vertical direction, a cell unit mask second position alignment operation of aligning a plurality of second position alignment holes of the deposition pattern portion at a thin film transistor (TFT) position of a TFT glass in the vertical direction, and a cell unit mask seating operation of seating the cell unit mask in the structural auxiliary mask opening.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Figure 1A:
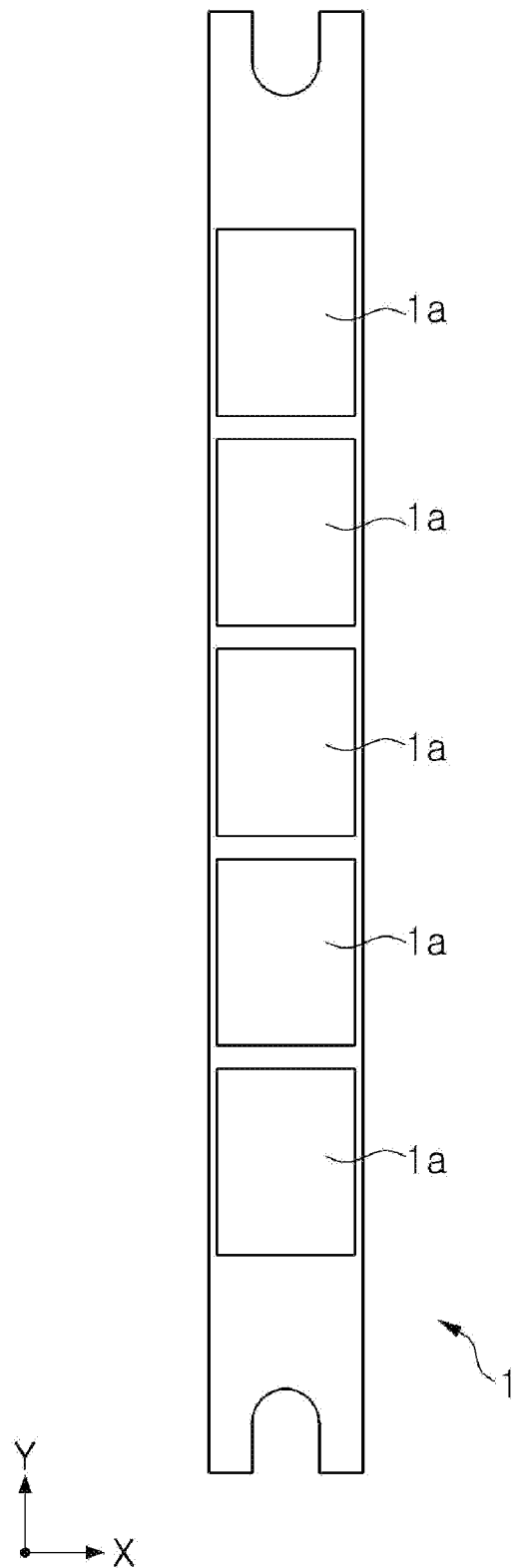
FIGS. 1A and 1B are schematic diagrams illustrating a stick mask according to a related art and a stretched and deformed state of the stick mask.
Figure 1B:
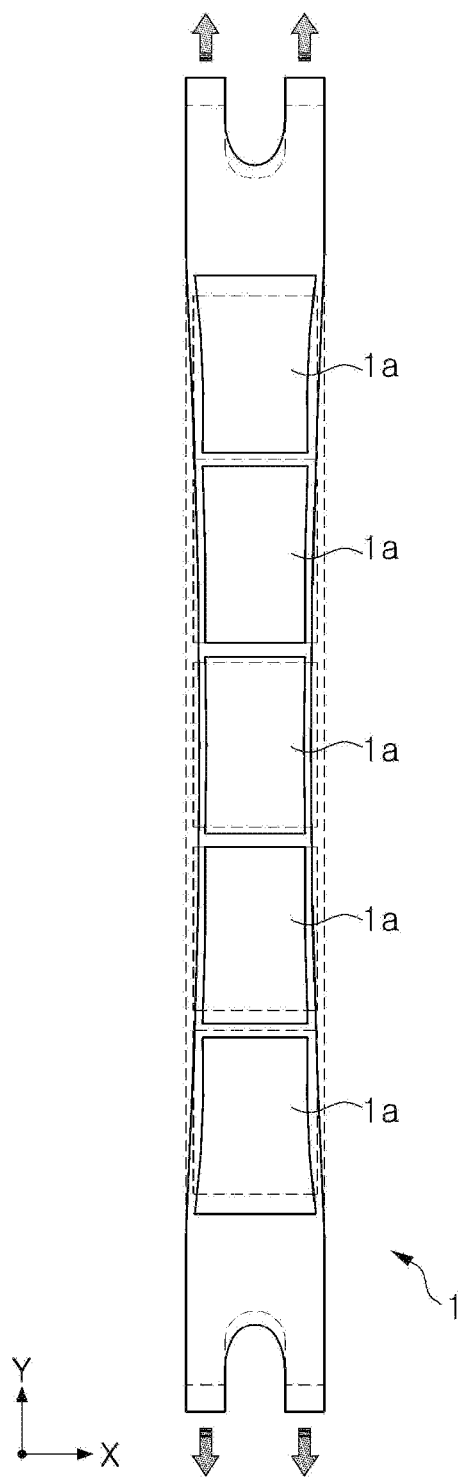
Figure 2:
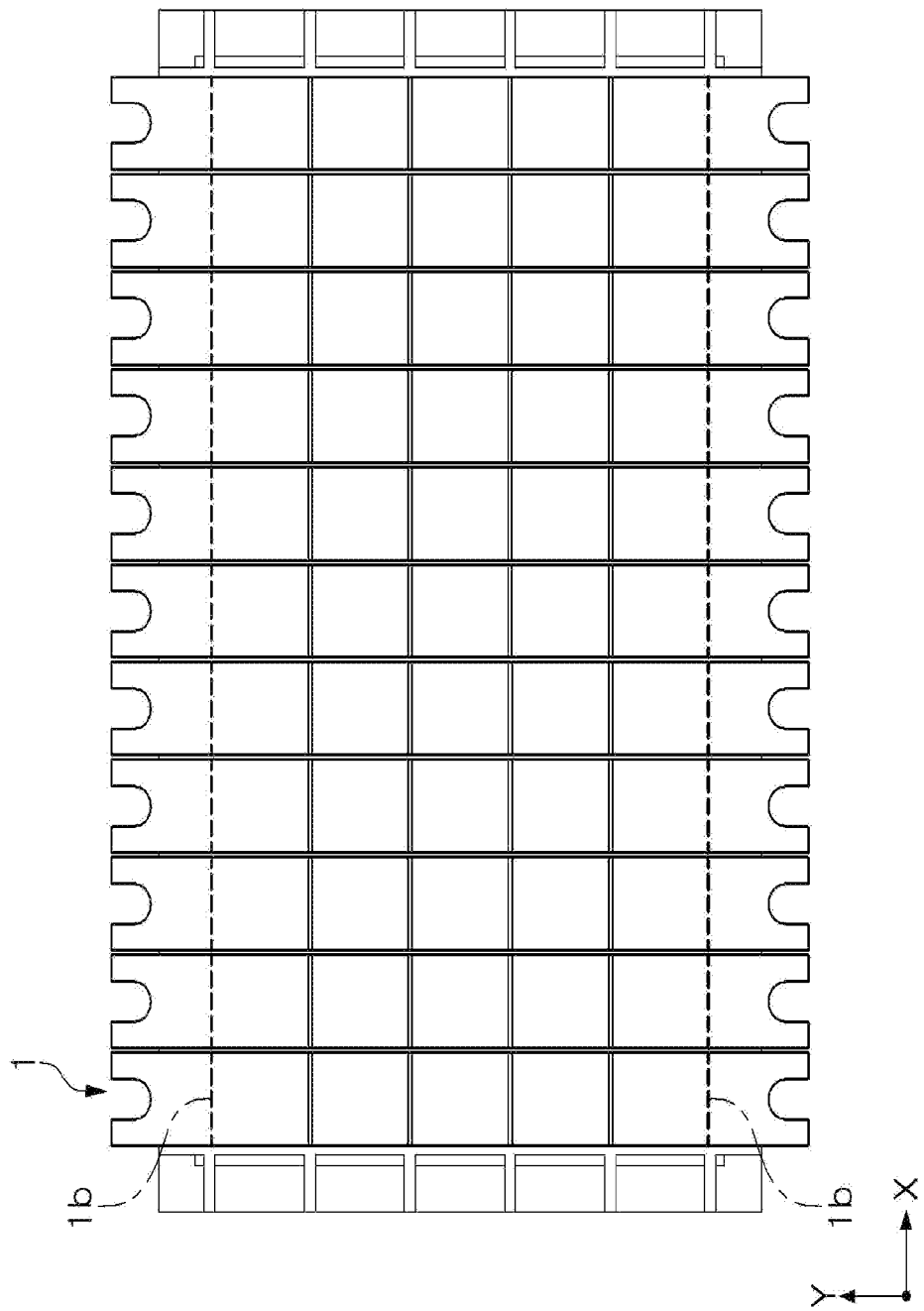
FIG. 2 is a schematic diagram for describing a problem which occurs when the stick mask according to the related art is welded to a frame.

Hereinafter, exemplary embodiments of the present invention will be described in detail with reference to the accompanying drawings. However, the present invention is not limited to the exemplary embodiments disclosed herein and may be implemented in other forms. These exemplary embodiments disclosed herein will be provided to make this disclosure thorough and complete and will fully convey the spirit of the present invention to those skilled in the art.

In this disclosure, when a component is referred to as being on another component, the component may be directly formed on the other component or a third component may be interposed between the component and the other component. Further, in the drawings, thicknesses and sizes are exaggerated to effectively describe technical contents.

Furthermore, while the terms such as a first, a second, a third, and the like are used to describe various components in various embodiments of the present disclosure, these components should not be limited to these terms. These terms are used only to distinguish one component from another component. Therefore, a first component as being referred in any one embodiment may be referred to as a second component in another embodiment. Each embodiment described and exemplified herein also includes a complementary embodiment. Further, in this disclosure, the term "and/or" is used to mean at least one of components listed before and after.

In this disclosure, the singular forms include plural forms unless the context clearly notes otherwise. Further, the terms "comprising," "having," or the like are used to specify that a feature, a number, a step, a component, or a combination thereof described herein exists, and they do not preclude the presence or addition of one or more other features, numbers, steps, components, or combinations thereof. Furthermore, in this disclosure, the term a "connection" is used to mean including both indirectly and directly connecting a plurality of components.

Moreover, in the following description of the present invention, if a detailed description of related known configurations or functions is determined to unnecessarily obscure the gist of the present invention, the detailed description thereof will be omitted.

Hereinafter, for convenience of description, a first direction refers to an X-axis of an orthogonal coordinates system in a horizontal width direction, and a second direction refers to a Y-axis of the orthogonal coordinates system in a vertical width direction. In this case, the first direction is perpendicular to the second direction.

Figure 3:
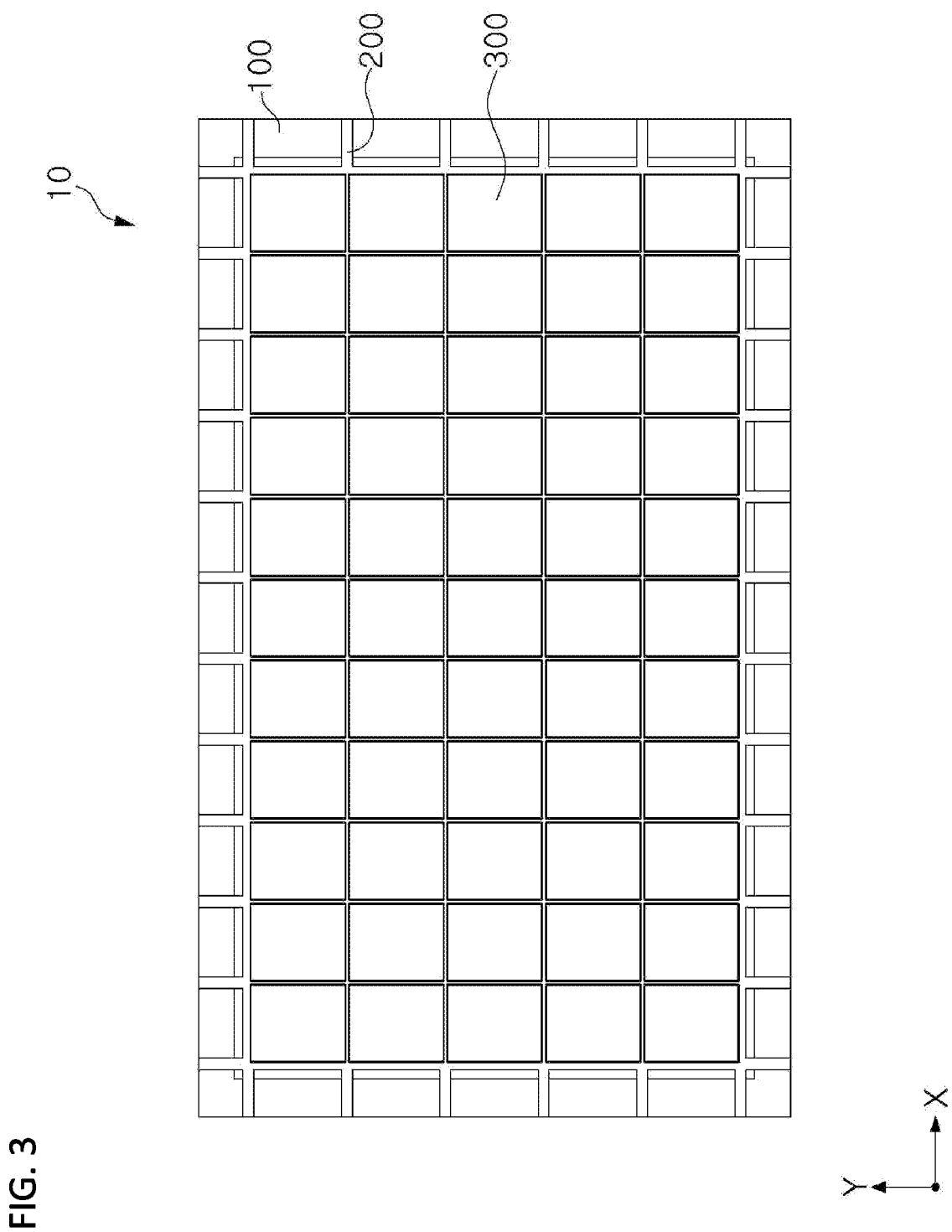
FIG. 3 is a plan view of a full-size mask assembly according to one embodiment of the present invention.
Figure 8:
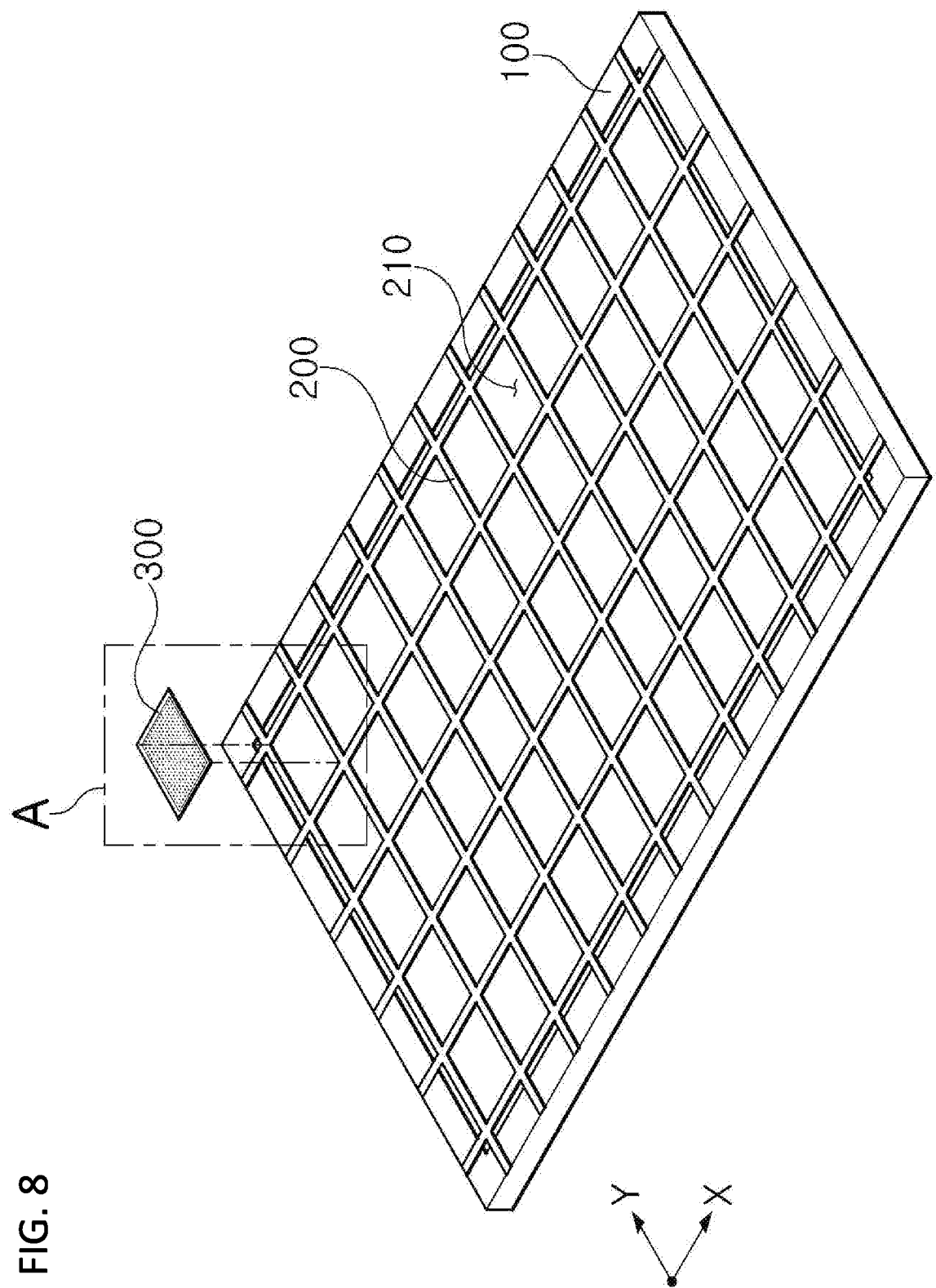
FIGS. 8 and 9 are schematic diagrams for describing a method in which a first position alignment of the cell unit mask is performed on the structural auxiliary mask fixed to the frame according to one embodiment of the present invention.

FIG. 3 is a plan view of a full-size mask assembly 10 according to one embodiment of the present invention, and FIG. 8 is a schematic diagram for describing a method in which a first position alignment of a cell unit mask 300 is performed on a structural auxiliary mask 200 fixed to a frame 100 according to one embodiment of the present invention.

Referring to FIGS. 3 and 8, the full-size mask assembly 10 according to one embodiment of the present invention may be used in a deposition process of depositing a deposition material on a substrate (not shown). The full-size mask assembly 10 may include the frame 100, the structural auxiliary mask 200, and a plurality of cell unit masks 300. In this case, the full-size mask assembly 10 may have a structure in which the frame 100, the structural auxiliary mask 200, and the cell unit mask 300 are sequentially stacked in a vertical direction.

Frame 100

Figure 4:
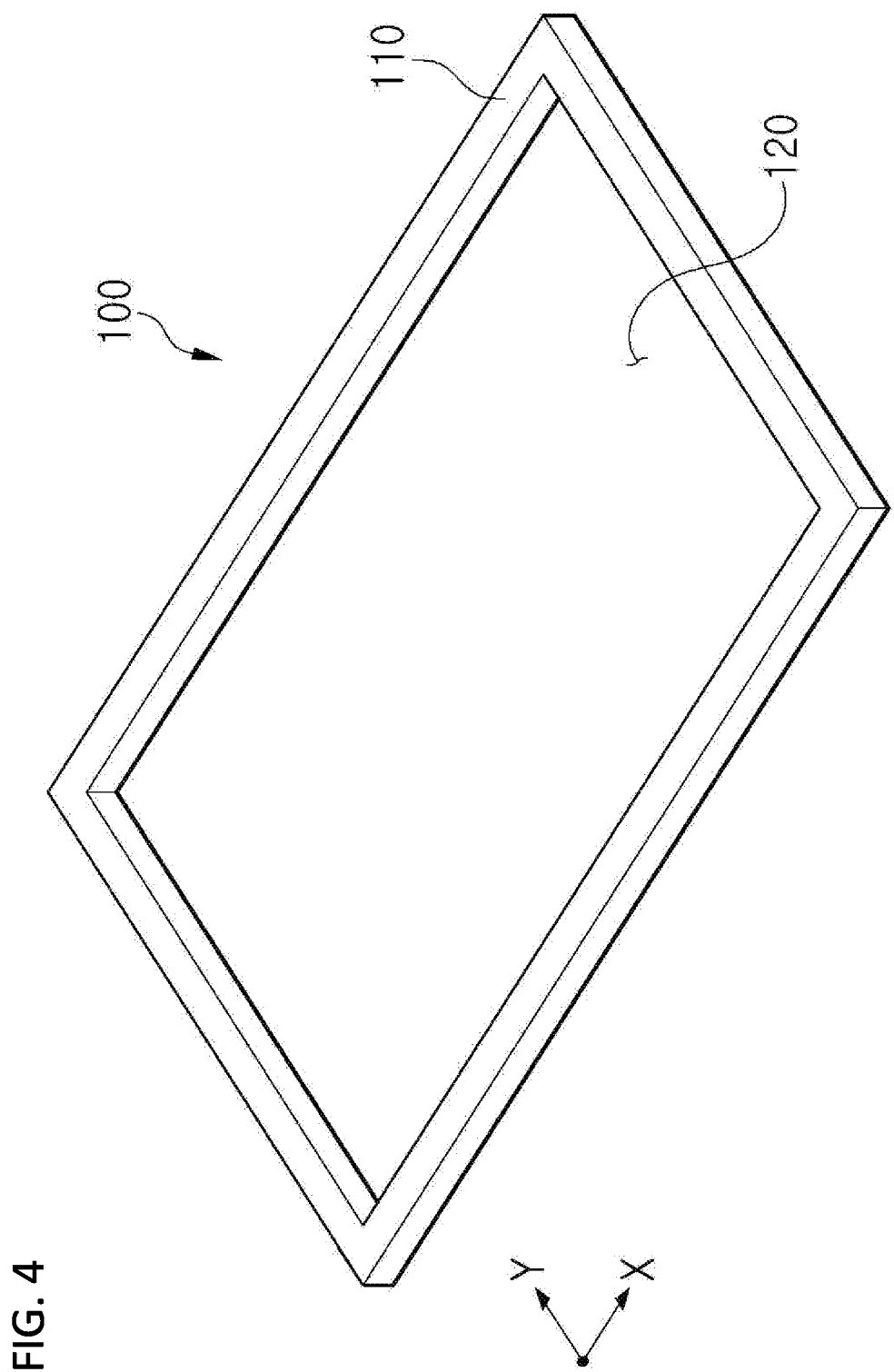
FIG. 4 is a perspective view of a frame according to one embodiment of the present invention.

FIG. 4 is a perspective view of the frame 100 according to one embodiment of the present invention.

Referring to FIGS. 3 and 4, the frame 100 according to one embodiment of the present invention may include a frame opening 120 thereinside and a support 110. The structural auxiliary mask 200, which will be described below, and the plurality of cell unit masks 300 may be coupled to the frame 100. The frame 100 may be made of a metal material having large rigidity so as to prevent deformation due to a compressive force acting in a stretching direction of the structural auxiliary mask 200 and the cell unit mask 300. Further, the frame 100 may have a predetermined thickness and a rectangular shape.

As shown in FIG. 4, one or more frame openings 120 may be formed at the frame 100. Accordingly, the frame opening 120 may have a substantially rectangular shape. The frame opening 120 may have a size and a shape corresponding to each of the plurality of cell unit masks 300, which will be described below, disposed at regular intervals so as to expose the plurality of cell unit masks 300 in the vertical direction.

The support 110 has a shape surrounding the frame opening 120 provided at a central portion of the support 110 and may be provided below the structural auxiliary mask 200, which will be described below, to support one surface of the structural auxiliary mask 200. That is, the support 110 may support a lower surface of the structural auxiliary mask 200 which is brought into surface contact with the support 110 in the vertical direction. Further, the support 110 may have a corresponding size and a corresponding shape to be capable of being coupled to the structural auxiliary mask 200.

The structural auxiliary mask 200, which is another component of the full-size mask assembly 10, will be described below.

Structural Auxiliary Mask 200

Figure 5:
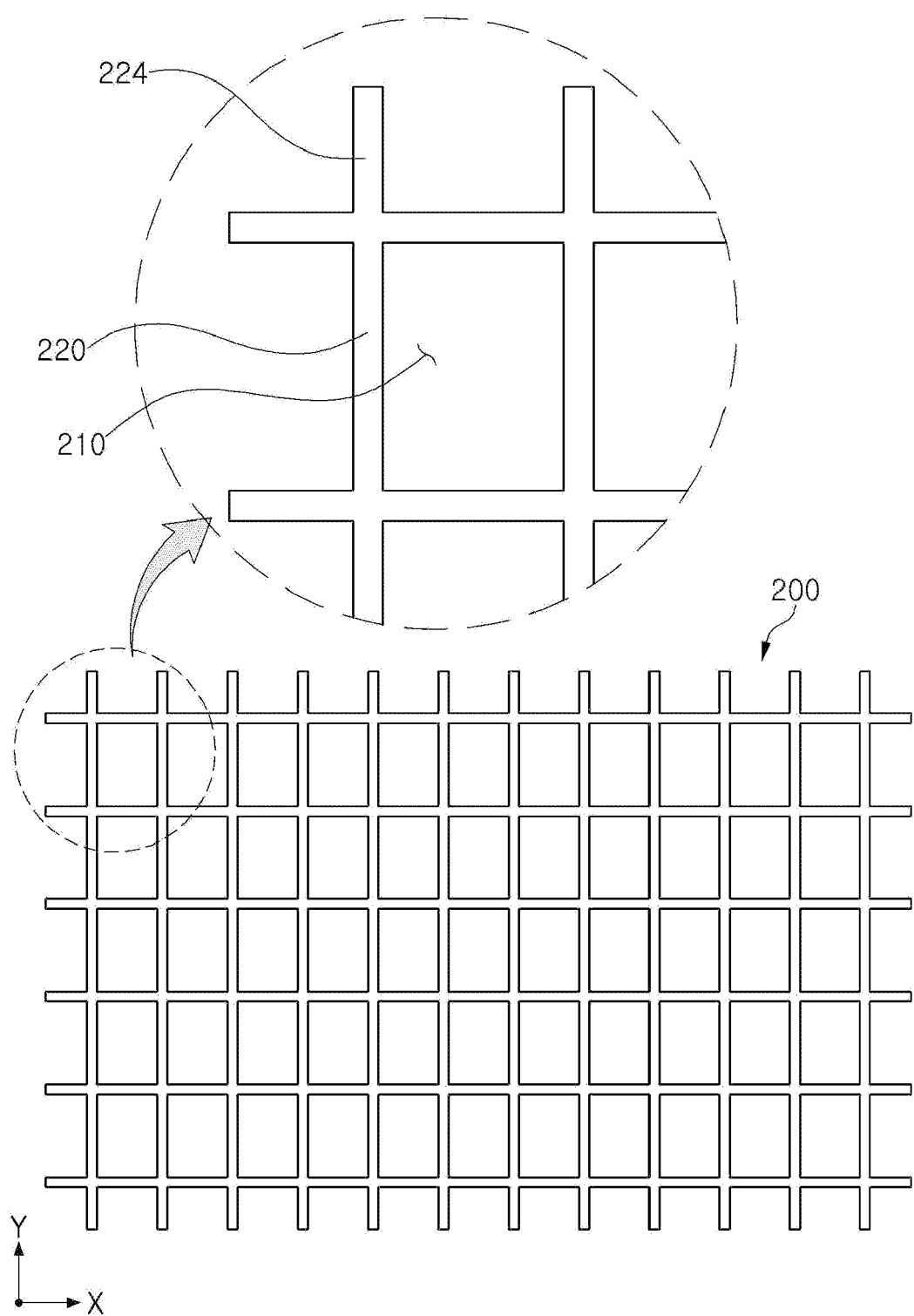
FIG. 5 is a schematic diagram illustrating a structure of a structural auxiliary mask according to one embodiment of the present invention.
Figure 6:
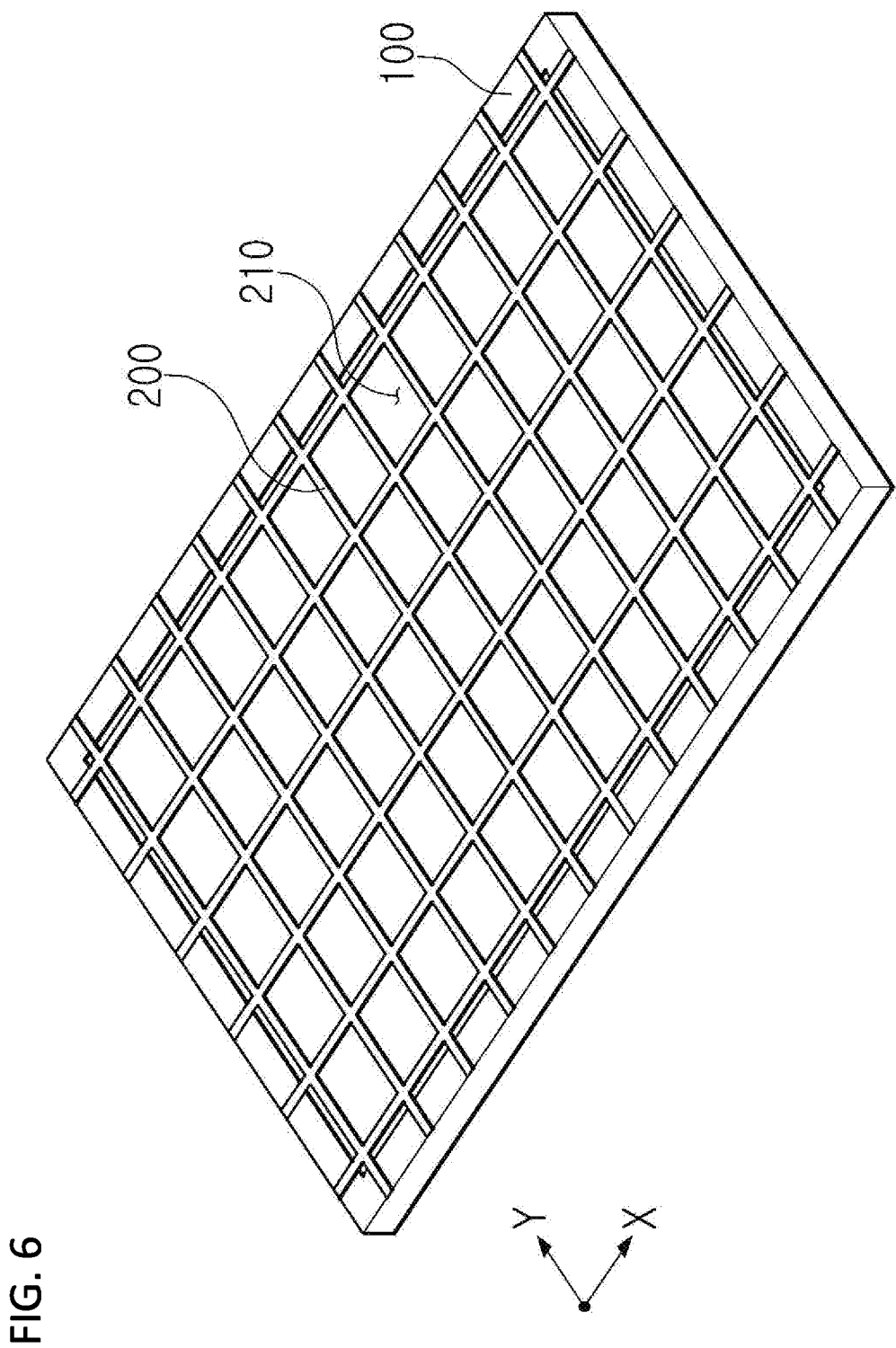
FIG. 6 is a perspective view illustrating the structure of the structural auxiliary mask fixed to the frame according to one embodiment of the present invention.
Figure 13:
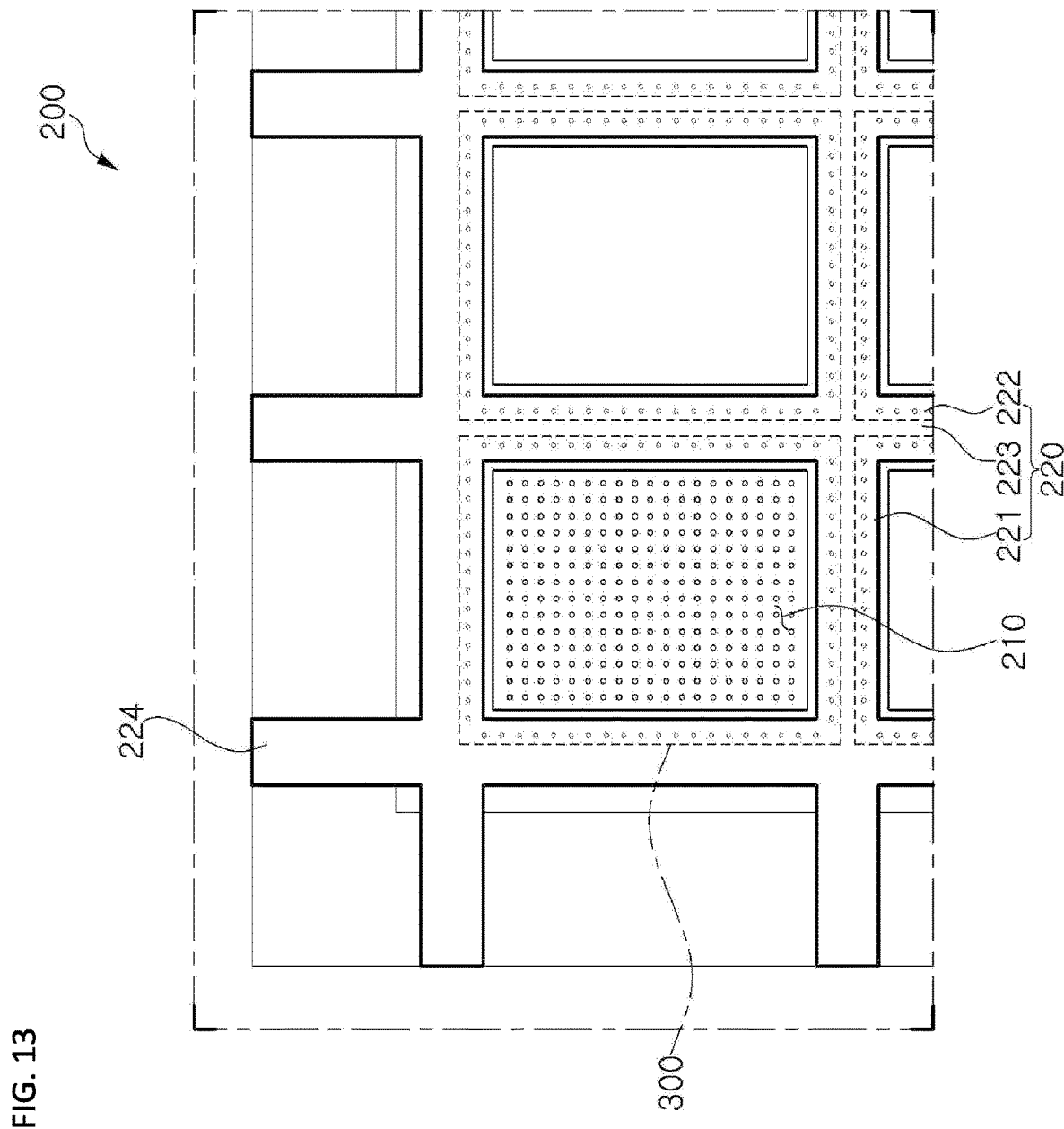
FIG. 13 is a schematic diagram illustrating the structural auxiliary mask in the full-size mask assembly according to one embodiment of the present invention.

FIG. 5 is a schematic diagram illustrating a structure of the structural auxiliary mask 200 according to one embodiment of the present invention, FIG. 6 is a perspective view illustrating the structure of the structural auxiliary mask 200 fixed to the frame 100 according to one embodiment of the present invention, and FIG. 13 is a schematic diagram illustrating the structural auxiliary mask 200 in the full-size mask assembly 10 according to one embodiment of the present invention.

Referring to FIGS. 3, 5, 6, and 13, the structural auxiliary mask 200 according to one embodiment of the present invention may maintain a total pitch, which is a manufacturing tolerance of the cell unit mask 300, to be constant and support the cell unit mask 300 which will be described. The structural auxiliary mask 200 may include a plurality of structural auxiliary mask openings 210, which are formed at a center of the structural auxiliary mask 200, and a plurality of shafts 220 constituting a grid. The structural auxiliary mask 200 may be interposed between the frame 100 and the plurality of cell unit masks 300.

In the structural auxiliary mask 200, the plurality of structural auxiliary mask openings 210 may be formed in a grid shape at the center of the structural auxiliary mask 200, and the plurality of shafts 220 constituting lattices may be symmetrically disposed in the first direction and the second direction. These structural auxiliary mask openings 210 have a grid shape because of convenience of manufacturing and processing, but they need not necessarily be disposed in the grid shape such as when sizes of the structural auxiliary mask openings 210 are different or irregular.

The structural auxiliary mask 200 may be configured such that sizes, shapes, widths (breadths), and the like of the plurality of shafts 220 are symmetrical so as to uniformly apply a tensile force to the frame 100 and the plurality of cell unit masks 300. The structural auxiliary mask 200 may be made of a material which has a high thermal expansion coefficient and does not cause deformation such as sagging and the like so as to prevent distortion due to heat generated during a process. Further, the structural auxiliary mask 200 may have a plate-shaped form and have a thickness in the range of 100 μm to 200 μm.

Structural Auxiliary Mask Opening 210

Referring back to FIGS. 5, 6, 8, and 13, the structural auxiliary mask opening 210 may have a substantially rectangular shape. The structural auxiliary mask opening 210 may have a grid region equal to a gap distance between the shafts 220 so as to expose a deposition pattern portion 310 of the cell unit mask 300, which will be described below, in the vertical direction. Further, the structural auxiliary mask opening 210 may be formed in a size and a shape which correspond to the deposition pattern portion 310. A single structural auxiliary mask opening 210 may correspond to a single cell unit mask 300. Accordingly, patterns corresponding to a plurality of organic light emitting devices (OLEDs) may be simultaneously deposited through a single process using a single full-size mask assembly 10.

Grid 220

Figure 9:
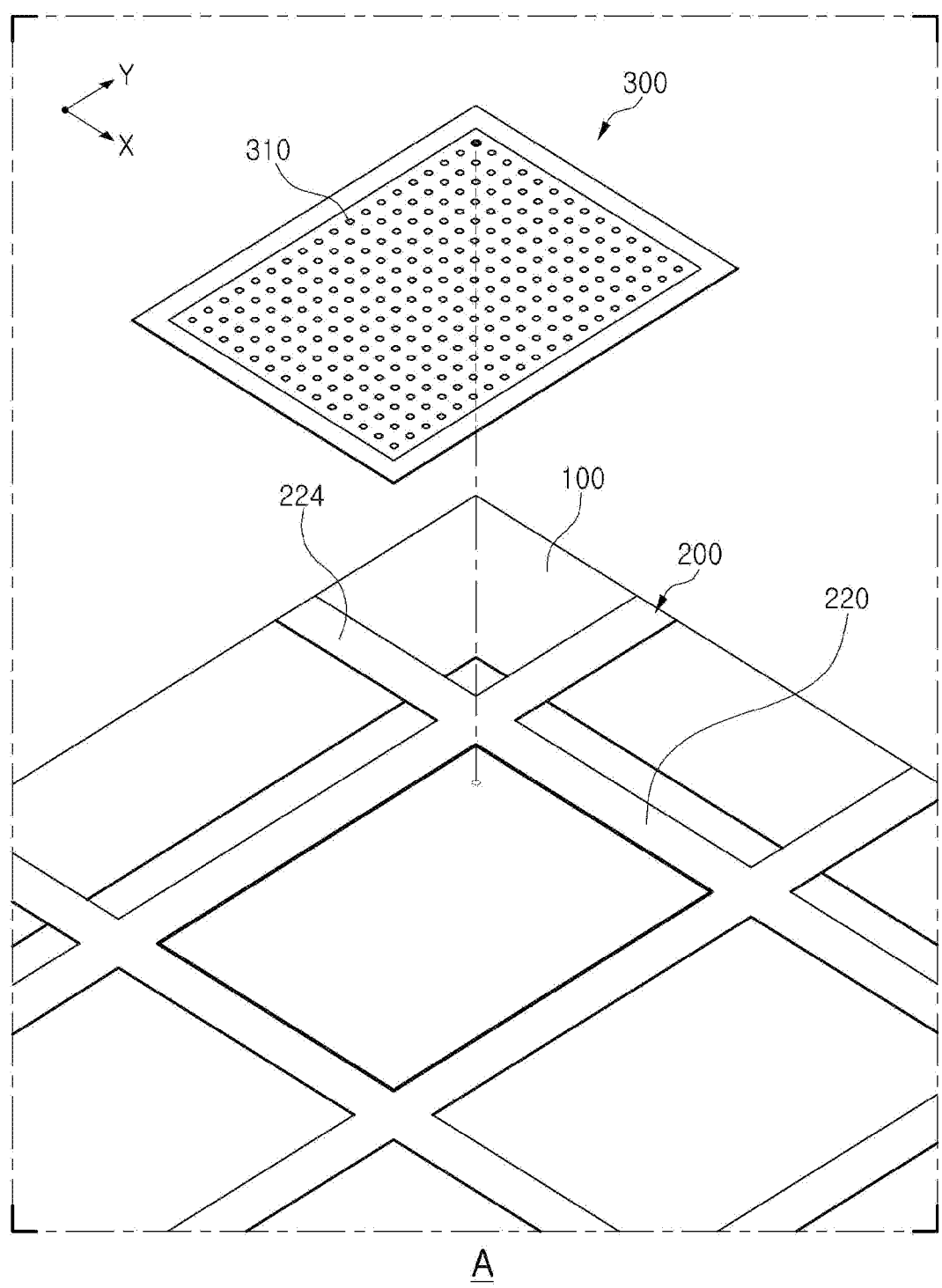
Figure 10:
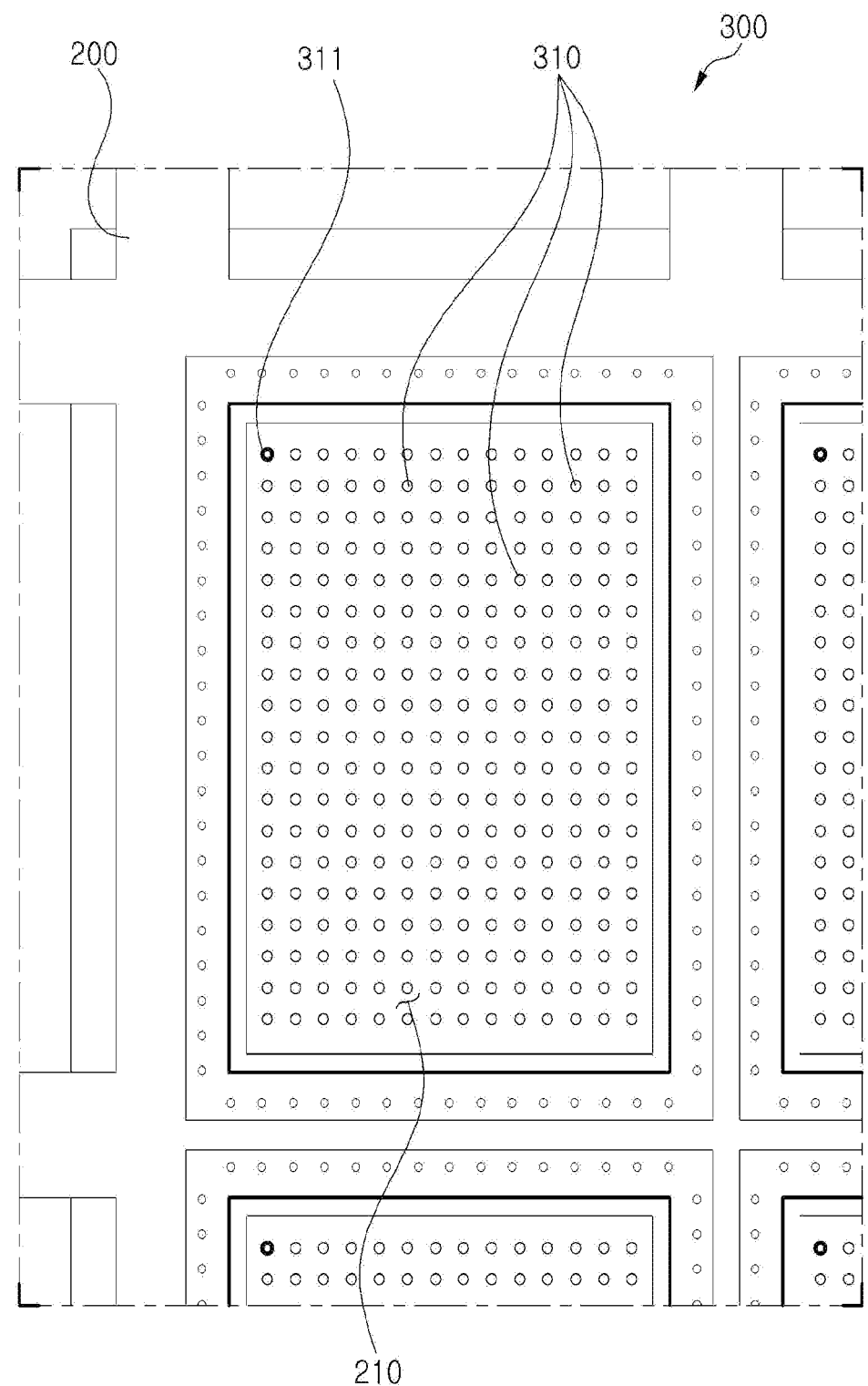
FIG. 10 is a schematic diagram illustrating a state in which the first position alignment of the cell unit mask according to one embodiment of the present invention is performed.

FIGS. 8 and 9 are schematic diagrams for describing a method in which a first position alignment of the cell unit mask 300 is performed on the structural auxiliary mask 200 fixed to the frame 100 according to one embodiment of the present invention, FIG. 10 is a schematic diagram illustrating a state in which the first position alignment of the cell unit mask 300 according to one embodiment of the present invention is performed, and FIG. 13 is a schematic diagram illustrating the structural auxiliary mask 200 in the full-size mask assembly 10 according to one embodiment of the present invention.

Referring to FIGS. 5 and 8 to 10, the shafts 220 may support each of the cell unit masks 300 by being brought into surface contact with a cell unit support of the cell unit mask 300 which will be described below. The shafts 220 may be generally provided in parallel in the first and second directions and may have the same width and length in each of the first and second directions. The shafts 220 may be disposed in a grid shape to provide a gap between the structural auxiliary mask openings 210.

Referring to FIG. 13, each of the shafts 220 may include a first cell unit support 221, a second cell unit support 222, and a cell unit spacer 223 and may further include a protrusion 224 at an end portion of each of the shafts 220.

The first cell unit support 221 may support the cell unit mask 300 in the first direction. The first cell unit support 221 may have a predetermined width in the second direction and may be brought into surface contact with the cell unit mask 300.

The second cell unit support 222 may support the cell unit mask 300 in the second direction. The second cell unit support 222 may have a predetermined width in the first direction and may be brought into surface contact with the cell unit mask 300. In this case, the second cell unit support 222 may support the cell unit mask 300 with a width different from that of the first cell unit support 221.

The cell unit spacer 223 is a region between the first cell unit support 221 and the second cell unit support 222, and a plurality of cell unit spacers 223 may be provided and spaced apart from one another to form a grid shape at predetermined intervals. The cell unit spacer 223 may have a region except for the first cell unit support 221 and the second cell unit support 222 in the shaft 220. That is, the cell unit masks 300 may be spaced apart a predetermined distance equal to the cell unit spacer 223. Unlike a stick mask, the cell unit spacer 223 may have a region which is not brought into contact with the cell unit mask 300 even in the second direction. That is, the cell unit spacer 223 refers to a region where the cell unit masks 300 are spaced apart without being brought into contact with one another in the first and second directions.

The protrusion 224 may be a region protruding and extending from an edge of the shaft 220. The protrusion 224 is a region held by a clamping device (not shown) so as to apply a tensile force to the structural auxiliary mask 200 and may be supported on the frame 100 by being brought into surface contact therewith. A pair of protrusions 224 in the first and second directions may be stretched in the first and second directions to stretch the structural auxiliary mask 200 to the frame 100.

In this case, in order to stretch the structural auxiliary mask 200, the clamping device (not shown) may be installed at each of the pair of protrusions 224. The clamping device (not shown) applies a tensile force to the pair of protrusions 224 such that the structural auxiliary mask 200 may be fixed to the frame 100 in a state of being tightly stretched. In this case, each of the pair of protrusions 224 may be configured with a region which is adhered to the frame 100 (hereinafter referred to as a "frame coupler") and a region which is not adhered thereto. Consequently, an interior of the frame 100 and the shaft 220 of the structural auxiliary mask 200 may be disposed to be spatially separated.

The frame coupler is an end portion of the protrusion 224 and is a region having a predetermined length. The frame coupler is a region which is brought into surface contact with the support 110 and is fixedly coupled to the frame 100 by welding or the like. The frame coupler allows the structural auxiliary mask 200 stretched in the first and second directions to be welded to the frame 100 by welding such that the frame 100 and the structural auxiliary mask 200 may be integrated. Alternatively, the structural auxiliary mask 200 may be fixed to the frame 100 through other methods instead of welding.

The frame coupler may minimize a contact region with the frame 100 to minimize a phenomenon in which thermal stress of the frame 100 is transferred to the structural auxiliary mask 200 and may further minimize thermal stress transferred to the cell unit masks 300 supported by the structural auxiliary mask 200.

A coupled structure of the frame 100 and the structural auxiliary mask 200 in the full-size mask assembly 10, which is configured as described above, will be described below.

As shown in FIGS. 8 and 9, the full-size mask assembly 10 stretches the protrusions 224 facing each other at both ends of each of the shafts 220 constituting the structural auxiliary mask 200 in opposite directions. In this case, the frame 100 and the structural auxiliary mask 200 may be coupled through various methods, and FIG. 8 illustrates the full-size mask assembly 10 in a state in which the frame coupler of the structural auxiliary mask 200 is brought into contact with and welded to the support 110 of the frame 100 in a state in which the structural auxiliary mask 200 is stretched.

The cell unit mask 300, which is an another configuration of the full-size mask assembly 10, will be described below.

Cell Unit Mask 300

Figure 7A:
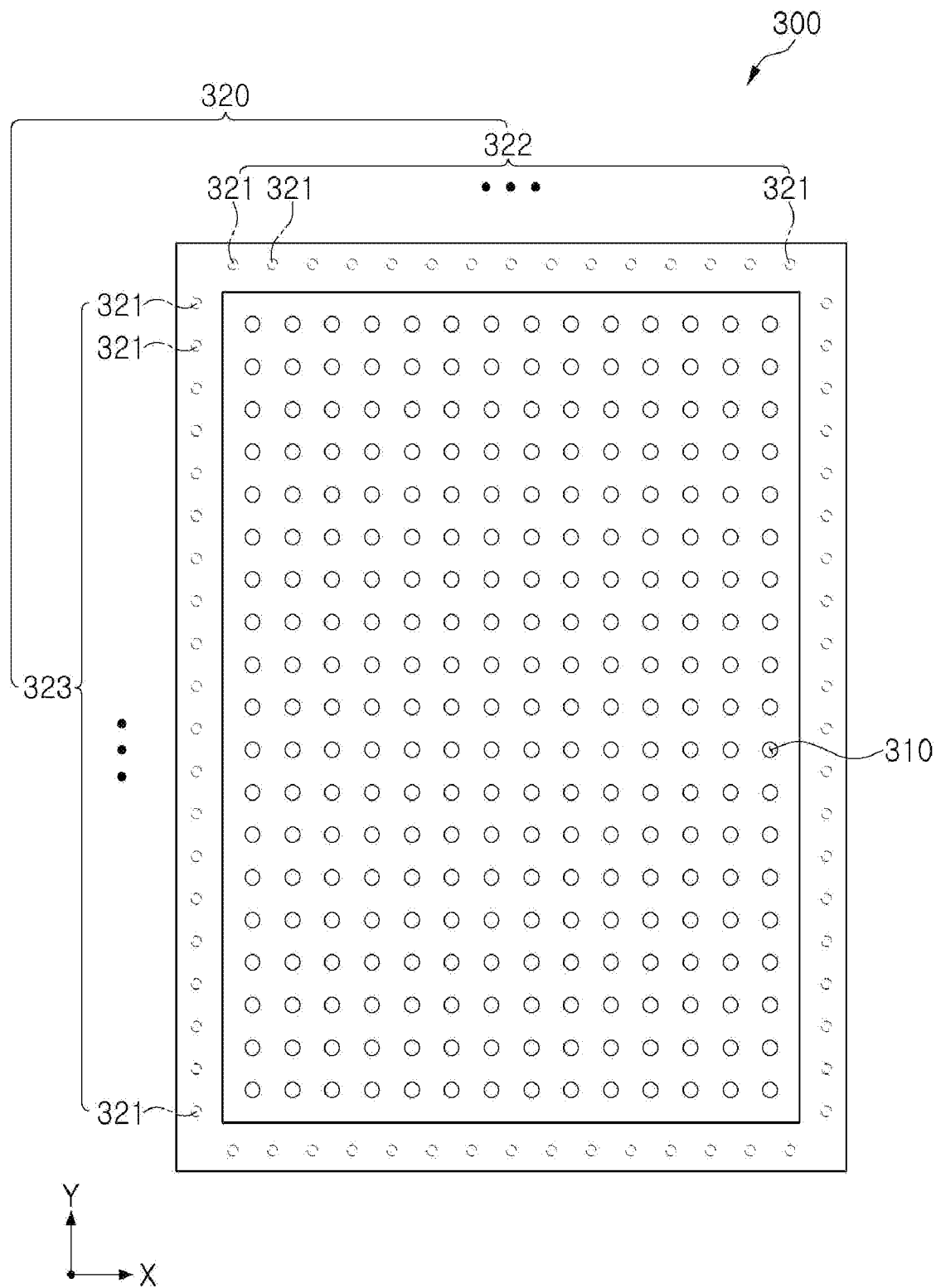
FIGS. 7A to 7C are schematic diagrams illustrating a structure of a cell unit mask according to one embodiment of the present invention.
Figure 7B:
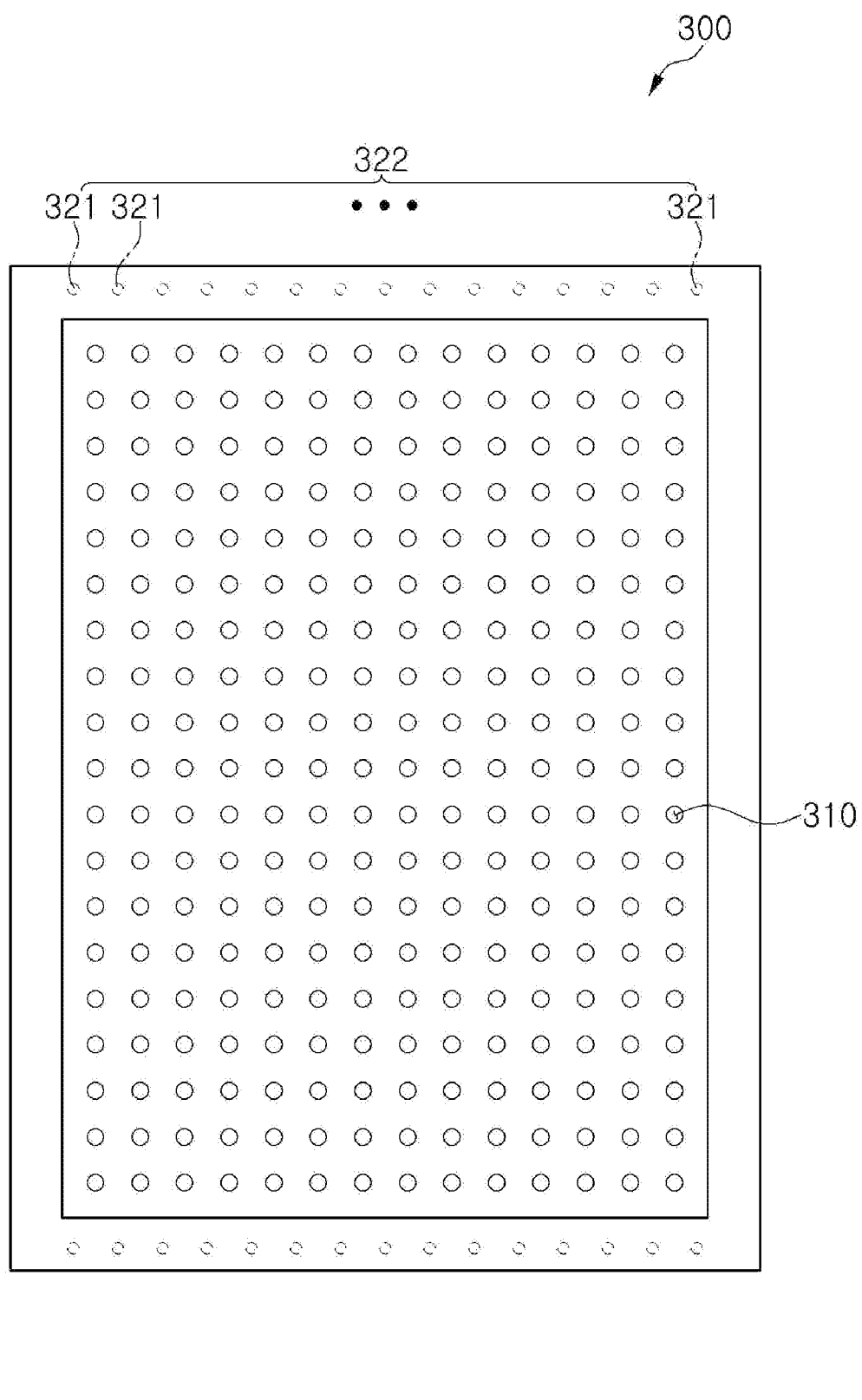
Figure 7C:
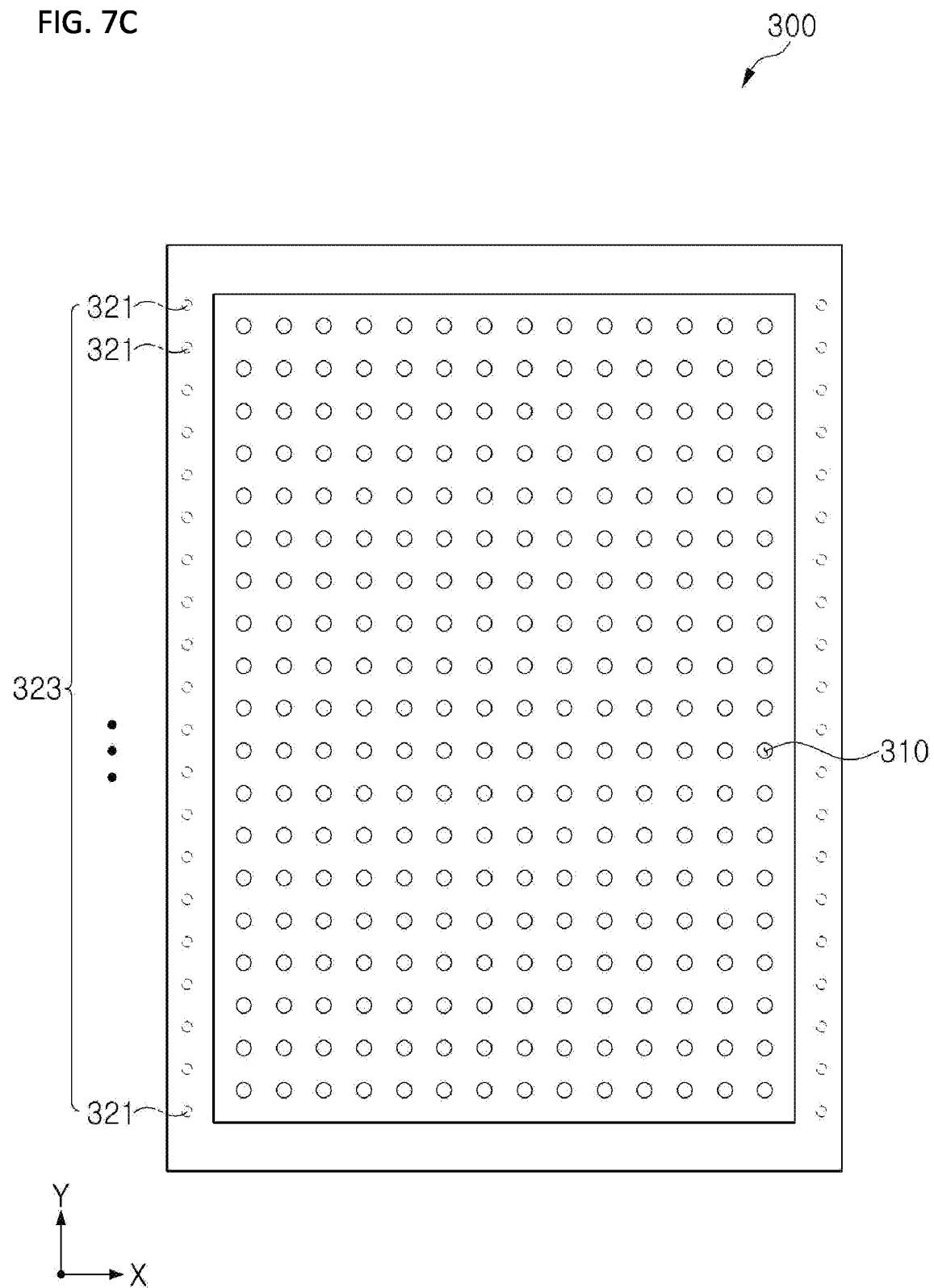

FIGS. 7A to 7C are schematic diagrams illustrating a structure of the cell unit mask 300 according to one embodiment of the present invention, and FIG. 13 is a schematic diagram illustrating the cell unit mask 300 in the full-size mask assembly 10 according to one embodiment of the present invention.

Referring to FIGS. 3 and 7A to 13, the cell unit mask 300 is used such that a deposition material is deposited on a substrate (not shown) by passing through the deposition pattern portion 310 during the deposition process to form a thin film (a metal layer or an organic light emitting layer) of a desired shape. The cell unit mask 300 may include the deposition pattern portion 310 and may further include a cell unit coupler 320. The cell unit mask 300 may have a plate-shaped form and a thickness in the range of 10 μm to 30 μm such that one surface of the cell unit mask 300 may be supported by being brought into direct surface contact with the structural auxiliary mask 200.

The cell unit mask 300 may have an area that is larger than that of the structural auxiliary mask opening 210 in the first and second directions. Further, the deposition pattern portion 310, which will be described below, may have an area that is smaller than that of the structural auxiliary mask opening 210 in the first and second directions. That is, the structural auxiliary mask opening 210 may be formed to have an area that is larger than that of the deposition pattern portion 310 but is smaller than that of the cell unit mask 300.

Deposition Pattern Portion 310

Figure 11:
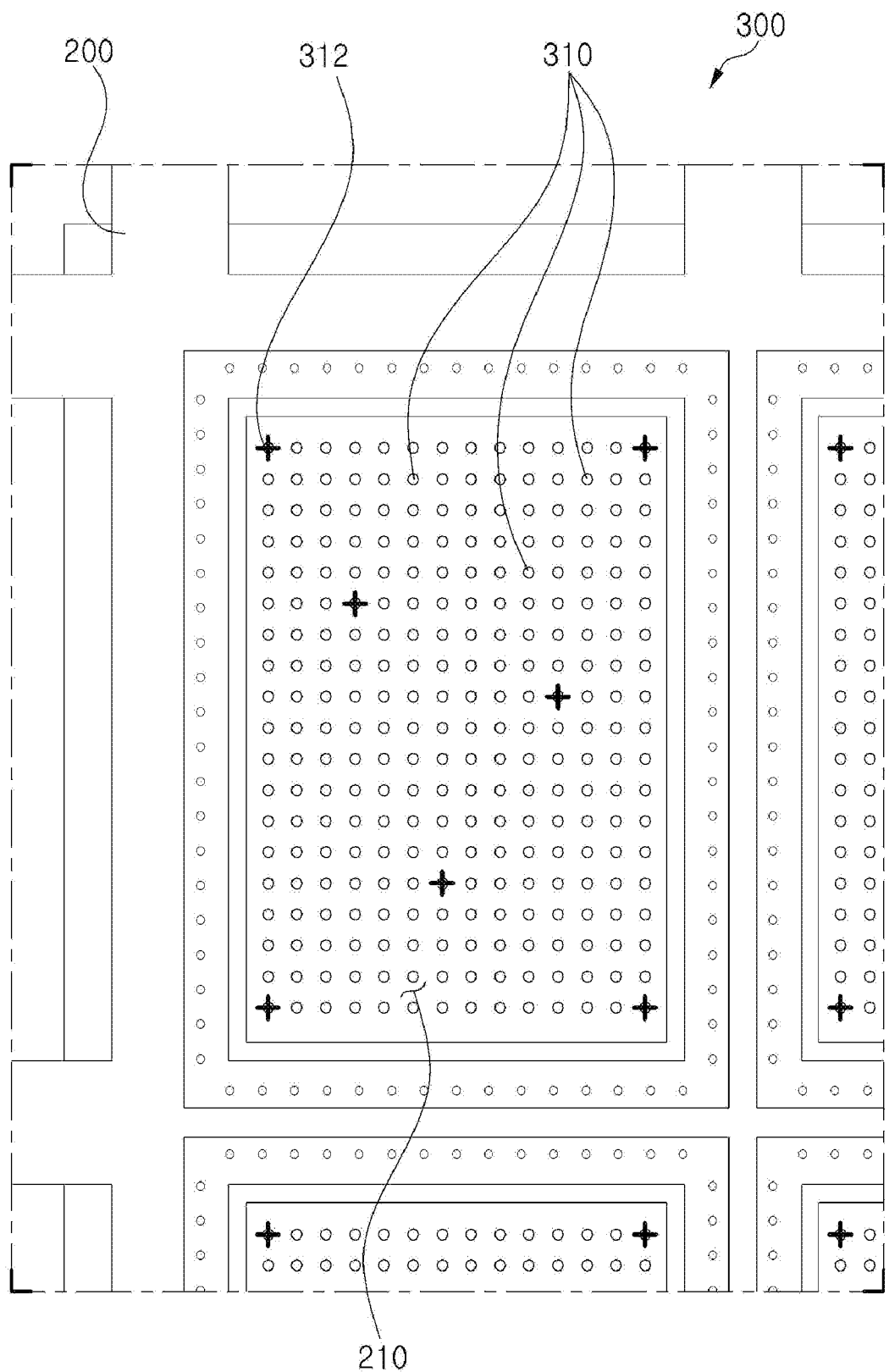
FIG. 11 is a schematic diagram illustrating a state in which a second position alignment of the cell unit mask according to one embodiment of the present invention is performed.

FIG. 10 is a schematic diagram illustrating a state in which the first position alignment of the cell unit mask 300 according to one embodiment of the present invention is performed, and FIG. 11 is a schematic diagram illustrating a state in which a second position alignment of the cell unit mask 300 according to one embodiment of the present invention is performed.

Referring to FIGS. 10 and 11, the deposition pattern portion 310 may be used to align a position of the cell unit mask 300 with the structural auxiliary mask 200 fixed to the frame 100 or may be used as one of R, G, and B pixels of an OLED for allowing a deposition material to pass therethrough during the deposition process. The deposition pattern portion 310 may include a first position alignment hole 311 and a second position alignment hole 312. Further, the deposition pattern portion 310 may be provided at positions facing the structural auxiliary mask opening 210. Although the deposition pattern portion 310 has been illustrated as an arrangement of a plurality of holes, the deposition pattern portion 310 may be formed as a plurality of slits in addition to the arrangement of the plurality of holes.

The first position alignment hole 311 may be used to perform the first position alignment of each of the cell unit masks 300 with the structural auxiliary mask 200. At this point, the first position alignment hole 311 may be located at a corner of one side of the deposition pattern portion 310. For the first position alignment, positions of the structural auxiliary mask opening 210 and the first position alignment hole 311 may be used. That is, since an inner length of the structural auxiliary mask opening 210 is longer than a length of the deposition pattern portion 310, prior to the second position alignment, the first position alignment hole 311 of the cell unit mask 300 may be located at a position corresponding to an interior of the structural auxiliary mask opening 210, thereby roughly aligning the cell unit mask 300.

The second position alignment hole 312 may be used to perform the second position alignment of each of the cell unit masks 300 with a thin film transistor (TFT) position of a TFT glass. In this case, the second position alignment hole 312 may be reference holes selected from the deposition pattern portion 310 configured with a plurality of holes. The second position alignment may be performed using a center of the second position alignment holes 312. Since the deposition pattern portion 310 of the cell unit mask 300 corresponds to the TFT position of the TFT glass during the deposition process, a position of each of the cell unit masks 300 may be aligned on the basis of absolute coordinates of a corresponding TFT position.

The cell unit support may be a region except for the region corresponding to the deposition pattern portion 310 in the cell unit mask 300. The cell unit support may be a region which is brought into surface contact with the shaft 220 and a portion of the cell unit support may be a region overlapping with the cell unit coupler 320. The cell unit support may be supported on the structural auxiliary mask 200 in a state of being brought into surface contact with the first cell unit support 221 in the first direction and with the second cell unit support 222 in the second direction.

Cell Unit Coupler 320

Figure 12:
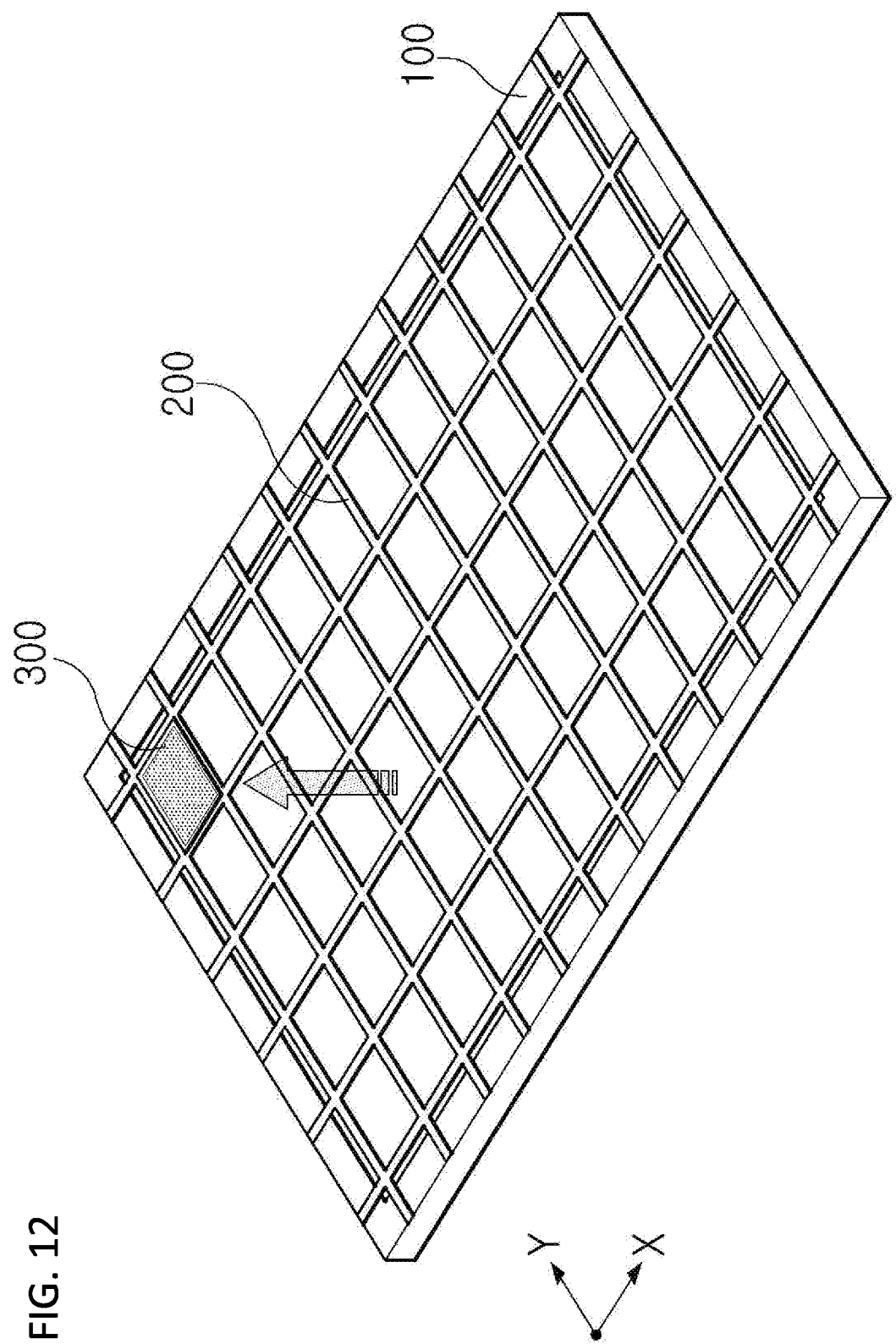
FIG. 12 is a schematic diagram illustrating a welding direction when the cell unit mask is coupled to the structural auxiliary mask by welding according to one embodiment of the present invention.

FIG. 12 is a schematic diagram illustrating a welding direction when the cell unit mask 300 is coupled to the structural auxiliary mask 200 by welding according to one embodiment of the present invention.

Referring back to FIGS. 7A to 7C and 13, the cell unit coupler 320 may be provided at one surface of the cell unit mask 300, i.e., at a lower surface of the cell unit mask 300, which is a surface of a deposition direction. The cell unit coupler 320 is a region of the cell unit support, which is fixedly coupled to the structural auxiliary mask 200 by welding or the like. When the cell unit coupler 320 is fixed to the structural auxiliary mask 200 by welding or the like, a plurality of welding points 321 may be provided and disposed along a circumferential surface of the cell unit mask 300 at regular intervals. The plurality of welding points 321 on the lower surface of the cell unit mask 300 and an upper surface of the structural auxiliary mask 200 may face each other to be coupled without spacing. Alternatively, the cell unit mask 300 may be fixed to the structural auxiliary mask 200 through other methods instead of welding.

The cell unit coupler 320 may include a first cell unit coupler 322 formed along the circumferential surface of the cell unit mask 300 in the first direction and/or a second cell unit coupler 323 formed along the circumferential surface thereof in the second direction.

According to one embodiment, the cell unit coupler 320 may be both of the first cell unit coupler 322 and the second cell unit coupler 323. According to another embodiment, the cell unit coupler 320 may be either the first cell unit coupler 322 or the second cell unit coupler 323.

This is proportional to the size of the deposition pattern portion 310. That is, when the size of the deposition pattern portion 310 is relatively large, both of the first cell unit coupler 322 and the second cell unit coupler 323 may be welded to enhance coupling strength with the structural auxiliary mask 200. On the other hand, when the size of the deposition pattern portion 310 is relatively small, the cell unit mask 300 may be easily supported even with a small coupling region such that either the first cell unit coupler 322 or the second cell unit coupler 323 may be selectively welded. That is, while the cell unit support of the cell unit mask 300 is supported by the first cell unit support 221 and the second cell unit support 222 of the structural auxiliary mask 200, the first cell unit coupler 322 and/or the second cell unit coupler 323 of the cell unit mask 300 may be welded at the lower surface of the cell unit mask 300 by a laser beam (not shown) located below the full-size mask assembly 10.

As shown in FIG. 12, the first cell unit coupler 322 and/or the second cell unit coupler 323 is welded to the lower surface of the cell unit mask 300 which is a rear surface to the contact surface of the TFT glass of the full-size mask assembly 10, i.e., the deposition surface, by the laser beam (not shown) located below the full-size mask assembly 10 such that, even when a bur is generated during welding, the substrate may be attached to the full-size mask assembly without spacing during the deposition process.

Further, in a state of being supported by the structural auxiliary mask 200, a plurality of cell unit masks 300 constituting the full-size mask assembly 10 may be intermittently provided in the first and second directions. That is, the each of the cell unit masks 300 may be fixedly coupled to the structural auxiliary mask 200 in the first and second directions in a state of being spaced a width of the cell unit spacer 223 apart.

A coupled structure of the structural auxiliary mask 200 and the cell unit mask 300 in the full-size mask assembly 10, which is configured as described above, will be described below.

As shown in FIGS. 10 and 11, the full-size mask assembly 10 may be configured such that the first position alignment and the second position alignment, which are a series of processes, are performed on the cell unit mask 300 such that the cell unit mask 300 is coupled to the structural auxiliary mask 200.

While the cell unit mask 300 is supported by a cell mask gripper (not shown), a tensile force is applied in the first and second directions such that the first position alignment of the cell unit mask 300 may be performed to allow the first position alignment hole 311 of the cell unit mask 300 to be located within the structural auxiliary mask opening 210 of the structural auxiliary mask 200. Then, the second position alignment may be performed by aligning a center of the second position alignment holes 312 of the cell unit mask 300 with the TFT position of the TFT glass in the vertical direction.

The cell mask gripper (not shown) may control the position of the cell unit mask 300 by a vacuum method, an electrostatic induction method, or the like. The cell mask gripper (not shown) may control not only a position value of the cell unit mask 300 but also flatness of a horizontal direction in the first and second directions as well as the vertical direction.

Figure 14:
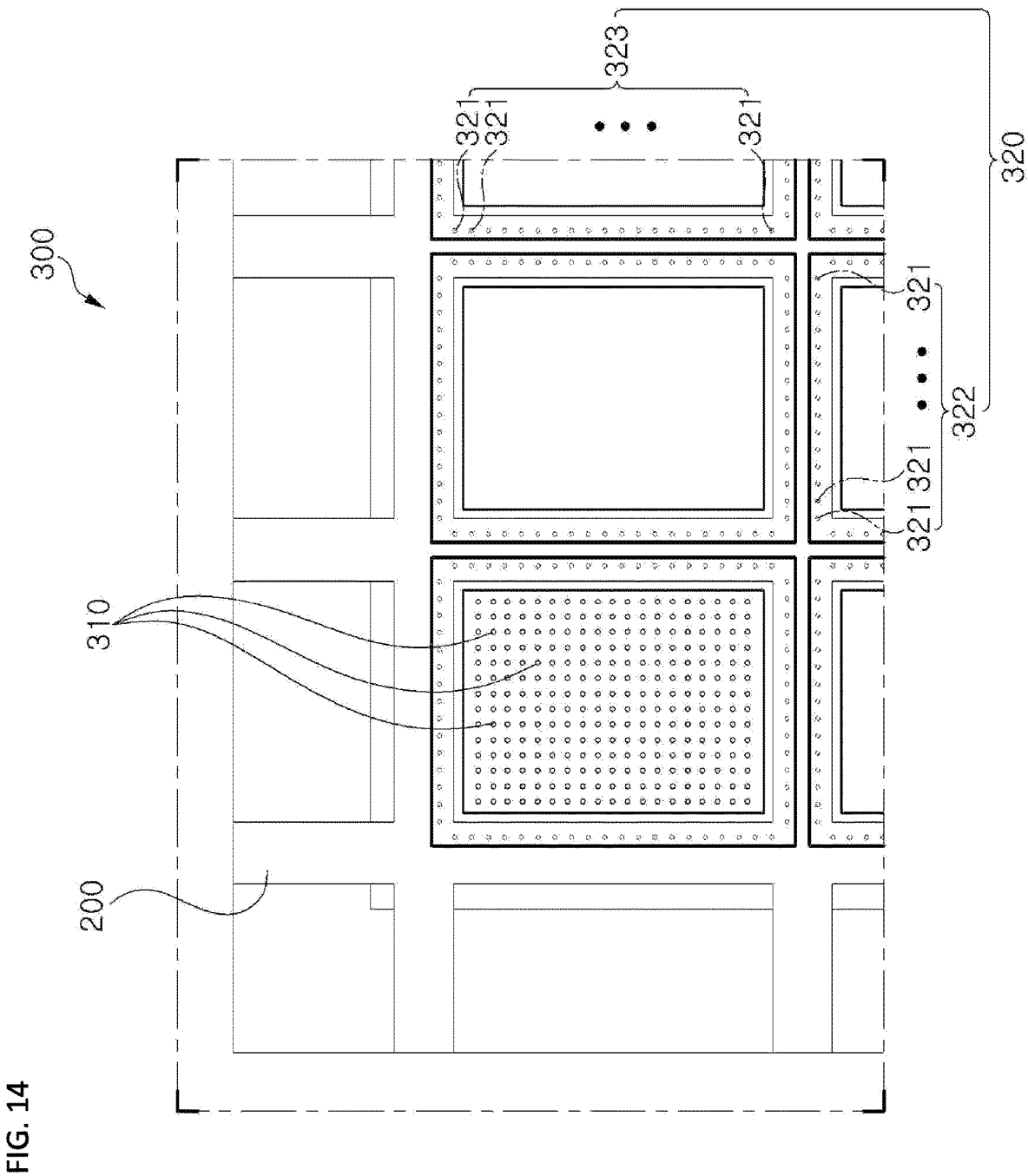
FIG. 14 is a schematic diagram illustrating the cell unit mask in the full-size mask assembly according to one embodiment of the present invention.

In this case, the structural auxiliary mask 200 and each of the cell unit masks 300 may be coupled by various methods, and in the full-size mask assembly 10 shown in FIGS. 13 and 14, the structural auxiliary mask 200 and each of the cell unit masks 300 may be welded along the welding points 321 of the cell unit coupler 320 provided at an edge of the cell unit mask 300.

Hereinafter, a manufacturing method of a full-size mask assembly according to one embodiment of the present invention will be described with reference to FIGS. 12, 15, and 16.

Figure 15:
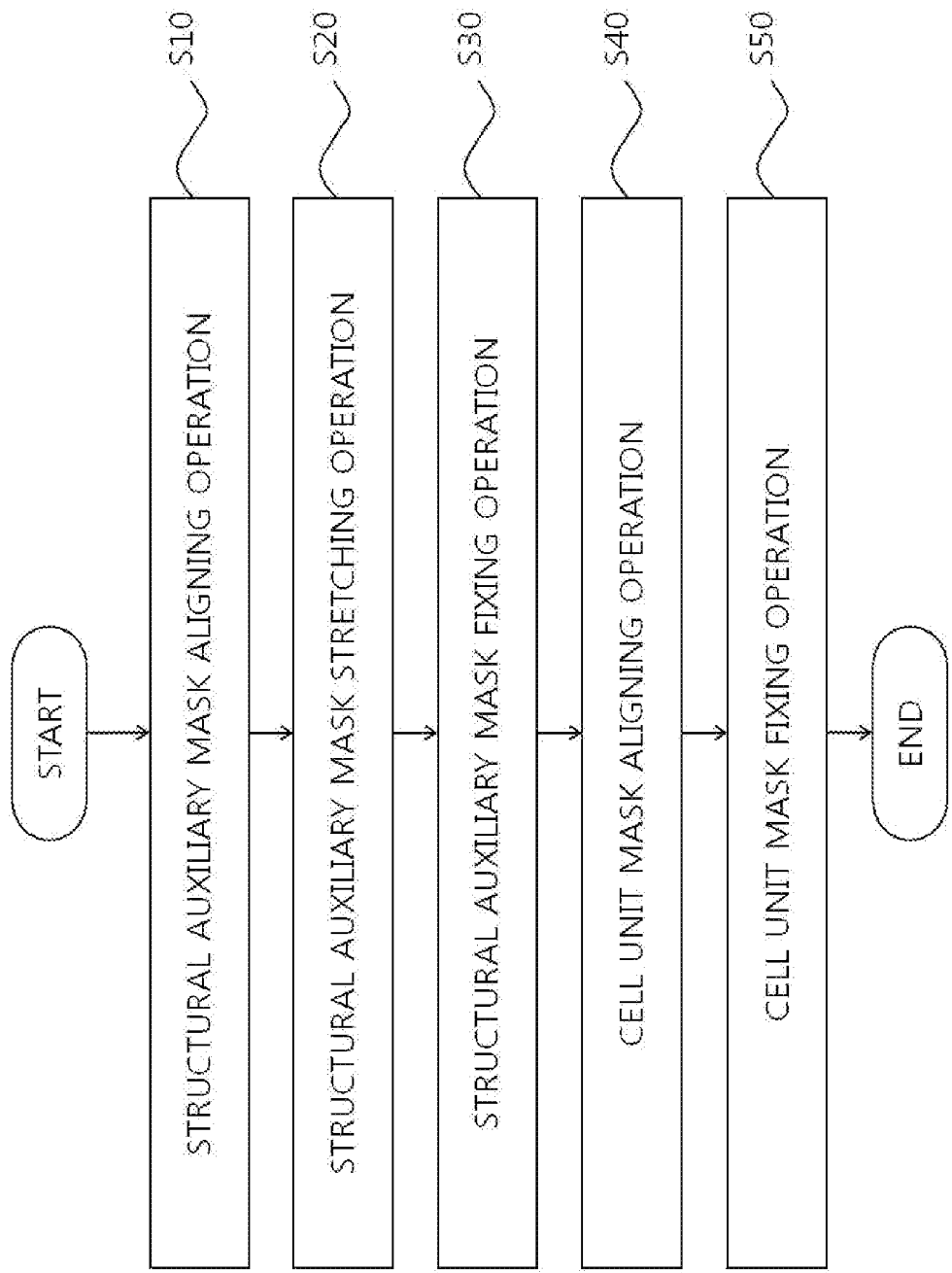
FIG. 15 is a flowchart illustrating a manufacturing method of a full-size mask assembly according to one embodiment of the present invention.
Figure 16:
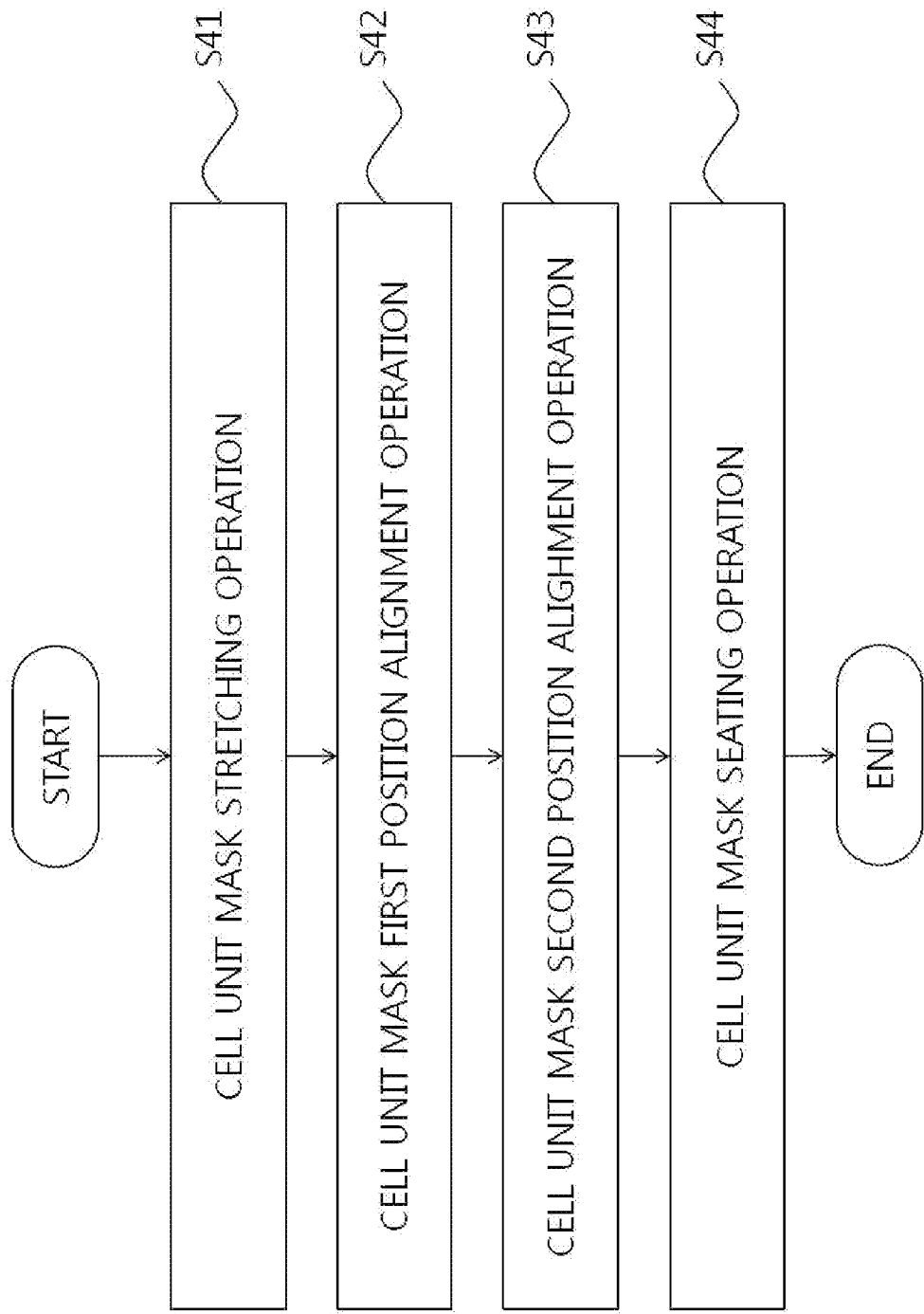
FIG. 16 is a flowchart illustrating a method of aligning a cell unit mask in FIG. 15.

FIG. 15 is a flowchart illustrating a manufacturing method of a full-size mask assembly according to one embodiment of the present invention, and FIG. 16 is a flowchart illustrating a method of aligning the cell unit mask 300 in FIG. 15.

As shown in FIG. 15, the manufacturing method of a full-size mask assembly may include a structural auxiliary mask aligning operation S10, a structural auxiliary mask stretching operation S20, a structural auxiliary mask fixing operation S30, a cell unit mask aligning operation S40, and a cell unit mask fixing operation S50.

In the structural auxiliary mask aligning operation S10, the structural auxiliary mask 200 may be aligned with the frame opening 120 of the frame 100 by facing the frame opening 120.

In the structural auxiliary mask stretching operation S20, the structural auxiliary mask 200 may be stretched in the first and second directions using a clamping device (not shown). The protrusions 224 facing each other at both ends of the shaft 220 in the structural auxiliary mask 200 are stretched in opposite directions while being held by the clamping device (not shown) such that a tension may be applied to the structural auxiliary mask 200.

In the structural auxiliary mask fixing operation S30, the structural auxiliary mask 200 may be fixed to frame 100 by coupling the frame 100 and the structural auxiliary mask 200 through welding. A frame coupler of the structural auxiliary mask 200 may be welded in a state of being brought into surface contact with the support 110 of the frame 100.

In the cell unit mask aligning operation S40, the cell unit mask 300 may be aligned with the structural auxiliary mask opening 210 of the structural auxiliary mask 200 by facing the structural auxiliary mask opening 210. The cell unit mask aligning operation S40 may be divided into the following operations.

As shown in FIG. 16, the cell unit mask aligning operation S40 may include a cell unit mask stretching operation S41, a cell unit mask first position alignment operation S42, a cell unit mask second position alignment operation S43, and a cell unit mask seating operation S44.

In the cell unit mask stretching operation S41, a cell mask gripper (not shown) may apply a tensile force to each of the cell unit masks 300 in the first and second directions. That is, the cell mask gripper (not shown) capable of applying a tensile force to the cell unit mask 300 may stretch the cell unit mask 300 in the first and second directions while supporting one surface of the cell unit mask 300 in the vertical direction.

In the cell unit mask first position alignment operation S42, the cell mask gripper (not shown) may move each of the cell unit masks 300 to each of the structural auxiliary mask openings 210. That is, in a state of applying the tensile force to support the cell unit mask 300, the cell mask gripper (not shown) may perform the first position alignment of the cell unit mask 300 to allow the first position alignment hole 311 of the cell unit mask 300 to be located within the structural auxiliary mask opening 210.

In the cell unit mask second position alignment operation S43, a position of each of the cell unit masks 300 may be aligned using a camera (not shown). The second position alignment of the cell unit mask 300 may be performed by determining whether the center of the second position alignment holes 312 coincides with the center of the TFT position of the TFT glass within 1 μm in the first and second directions through the camera (not shown) located below the full-size mask assembly 10 and by finely adjusting a position of the cell mask gripper (not shown) in the first direction or the second direction.

In the cell unit mask seating operation S44, the cell unit mask 300 may be seated in the structural auxiliary mask opening 210. The cell unit mask 300 may be seated in the structural auxiliary mask opening 210 by vertically moving the cell mask gripper (not shown).

That is, the positions of the cell unit masks 300 are aligned in the first and second directions in the cell unit mask first position alignment operation S42 and the cell unit mask second position alignment operation S43 and are aligned in the vertical direction in the cell unit mask seating operation s44 such that each of the positions of the cell unit masks 300 may be aligned within the full-size mask assembly 10.

In the cell unit mask fixing operation S50, the cell unit coupler 320 may be formed between the structural auxiliary mask 200 and the cell unit mask 300 to fix the cell unit mask 300 to the structural auxiliary mask 200. In this case, the cell unit mask 300 may be fixed by welding or the like.

To describe the cell unit mask fixing operation S50 using welding among various embodiments, in a state in which the cell unit mask 300 is seated by the cell mask gripper (not shown) and then is supported on the structural auxiliary mask 200, the first cell unit coupler 322 and/or the second cell unit coupler 323 provided along the edge of the cell unit mask 300 may be coupled to the structural auxiliary mask 200.

More specifically, the cell unit mask 300 may be welded through the welding points 321 formed at the first cell unit coupler 322 and/or the second cell unit coupler 323 using a laser beam (not shown) located below the full-size mask assembly 10.

Meanwhile, a manufacturing method of a full-size mask assembly according to another embodiment may include a cell unit mask aligning operation in which the cell unit mask 300 is aligned with the structural auxiliary mask opening 210 of the structural auxiliary mask 200 fixed to the frame 100 by facing the structural auxiliary mask opening 210.

The cell unit mask aligning operation may include a cell unit mask stretching operation of applying, by a cell mask gripper (not shown), a tensile force to the cell unit mask 300 in the first and second directions, a cell unit mask first position alignment operation of aligning the first position alignment hole 311, which is located at a corner of one side of the deposition pattern portion 310 through which a deposition material passes, within the structural auxiliary mask opening 210 in the vertical direction, a cell unit mask second position alignment operation of aligning the plurality of second position alignment holes 312 of the deposition pattern portion 310 at the TFT position of the TFT glass in the vertical direction, and a cell unit mask seating operation of seating the cell unit mask 300 at the structural auxiliary mask opening 210.

According to the embodiments of the present invention, a mask manufacturing area can be minimized by providing cell unit masks to facilitate the mask manufacturing such that there are advantages of an increase in production efficiency, possibility in manufacturing of a high precision mask, and reduction in unit cost of production.

Further, according to the embodiments of the present invention, the cell unit mask is implemented and thus it is possible to solve a problem that a full-size mask using a stick mask is difficult to correspond to enlargement in size of an original glass such that there is an advantage of being capable of manufacturing a 6th generation full size or more.

Furthermore, according to one embodiment of the present invention, a tensile force can be applied to the cell unit mask in an X-direction as well as a Y-direction by implementing the cell unit mask such that there is an advantage in that a total pitch of a mask can be controlled more precisely.

Moreover, according to one embodiment of the present invention, each of the cell unit masks has two or more cell unit couplers such that durability can be improved by minimizing deformation due to use of a full-size mask assembly.

In addition, according to one embodiment of the present invention, a cell unit coupler having a plurality of welding points can be provided along a circumferential surface of the cell unit mask to enhance a coupling force of the cell unit mask in the full-size mask assembly such that there is an advantage of being capable of increasing productivity due to an increase of the number of times of cleaning, reduction in time required for mask replacement, and extension of a continuous operation time of a depositor.

Additionally, according to one embodiment of the present invention, a lower surface of the cell unit mask, which is a rear surface to a contact surface of a TFT glass, i.e., a deposition surface is welded and thus, even when a bur is generated during welding, a substrate can be coupled to the full-size mask assembly without spacing during a deposition process such that there is an advantage of being capable of preventing a deposition defect due to a shadow phenomenon.

While the present invention has been described in detail with reference to exemplary embodiments thereof, it should be construed that the scope of the present invention is not limited to a specific embodiment and is defined by the appended claims. Further, it should be understood that many alterations and modifications can be devised by those skilled in the art without departing from the scope of the present invention.

What is claimed is:

1. A full-size mask assembly comprising:
a frame having a frame opening formed therein and a support surrounding the frame opening;
a structural auxiliary mask supported by the support and having a plurality of shafts in a grid shape to form a plurality of structural auxiliary mask openings; and
a cell unit mask supported by the structural auxiliary mask and having a deposition pattern portion through which a deposition material passes, wherein
each of the plurality of shafts includes:
a first cell unit support for supporting the cell unit mask in a first direction;
a second cell unit support for supporting the cell unit mask in a second direction perpendicular to the first direction; and
a cell unit spacer for forming a grid shape between the first cell unit support and the second cell unit support at a predetermined interval and for not being brought into contact with the cell unit mask,
the cell unit mask further includes two or more cell unit couplers at one surface thereof,
each of the two or more cell unit couplers is a plurality of welding points which are disposed in parallel,
each of the two or more cell unit couplers is a first cell unit coupler formed along an end portion of the cell unit mask in a first direction or a second cell unit coupler formed in a second direction perpendicular to the first direction,
each of the two or more cell unit couplers includes:
a first cell unit coupler formed along an end portion of the cell unit mask in a first direction; and
a second cell unit coupler formed in a second direction perpendicular to the first direction,
the structural auxiliary mask is fixed to the frame in a state of being stretched in the first direction and the second direction, and
the cell unit mask is fixed to the structural auxiliary mask by welding a lower of the cell unit mask with a laser beam such that a substrate is attached to the full-size mask assembly without spacing during a deposition process.

2. The full-size mask assembly of claim 1, further comprising:
wherein the cell unit mask is coupled to the structural auxiliary mask.

3. The full-size mask assembly of claim 1, wherein a first position alignment hole is located at a corner of one side of the deposition pattern portion and is provided to be aligned within the structural auxiliary mask opening in a vertical direction.

4. The full-size mask assembly of claim 3, wherein:
a second position alignment hole is a plurality of reference holes of the deposition pattern portion; and
a center of the second position alignment hole is aligned with a thin film transistor (TFT) position of a TFT glass in the vertical direction.

5. The full-size mask assembly of claim 1, wherein:
the cell unit mask has an area that is larger than that of the structural auxiliary mask opening in the first direction and the second direction perpendicular to the first direction.

6. The full-size mask assembly of claim 1, wherein:
the deposition pattern portion has an area that is smaller than that of the structural auxiliary mask opening in the first direction and the second direction perpendicular to the first direction.

* * * * *